US012614960B2

(12) United States Patent
Ricks

(10) Patent No.: US 12,614,960 B2
(45) Date of Patent: Apr. 28, 2026

(54) SURFACE MOUNT HAPTIC ACTUATOR

(71) Applicant: PUI Audio, Inc., Fairborn, OH (US)

(72) Inventor: Barry Ricks, Fairborn, OH (US)

(73) Assignee: PUI AUDIO, INC., Fairborn, OH (US)

( * ) Notice: Subject to any disclaimer, the term of this patent is extended or adjusted under 35 U.S.C. 154(b) by 234 days.

(21) Appl. No.: 18/220,340

(22) Filed: Jul. 11, 2023

(65) Prior Publication Data

US 2024/0022155 A1 Jan. 18, 2024

Related U.S. Application Data

(60) Provisional application No. 63/388,382, filed on Jul. 12, 2022.

(51) Int. Cl.
*H02K 33/18* (2006.01)
*G06F 3/01* (2006.01)
*G06F 3/16* (2006.01)
*H05K 3/34* (2026.01)
*H05K 3/341* (2026.01)

(52) U.S. Cl.
CPC ............. *H02K 33/18* (2013.01); *G06F 3/016* (2013.01); *G06F 3/167* (2013.01); *H05K 3/341* (2013.01)

(58) Field of Classification Search
None
See application file for complete search history.

(56) References Cited

U.S. PATENT DOCUMENTS

| | | | |
|---|---|---|---|
| 2008/0216578 A1* | 9/2008 | Takashima | G06F 3/016 |
| | | | 73/649 |
| 2011/0198948 A1* | 8/2011 | Keisuke | H02K 5/225 |
| | | | 310/25 |
| 2021/0328491 A1* | 10/2021 | Takahashi | H02K 33/06 |

OTHER PUBLICATIONS

Dixon, T., "Good Vibrations: How Apple Dominates the Touch Feedback Game," IFIXIT, 17 pages, https://www.ifixit.com/News/16768/apple-taptic-engine-haptic-feedback (2019).
Web page of Vybronics, product information for vibration motors, 2 pages, https://www.vybronics.com/products (2023).
Web page of Precision Microdrives, product information for vibration motors, 24 pages, https://www.precisionmicrodrives.com/motors/vibration-motors (2021).
Web page of TDK Product Center, PiezoHapt™ Actuators, 6 pages, https://product.tdk.com/en/products/sw_piezo/haptic/piezohapt/index.html (2022).
Web page of Foster Electric Company, Limited, vibration actuators, 1 page (retrieved from the internet on Jul. 10, 2023) https://www.foster-electric.com/products/vibration actuator/.

* cited by examiner

*Primary Examiner* — Bernard Rojas
(74) *Attorney, Agent, or Firm* — Thompson Hine LLP

(57) ABSTRACT

Various implementations disclosed herein include a surface mountable haptic actuator that includes a housing defining an interior chamber and a movable magnetic weight structure suspended within the interior chamber by a flexible member. The surface mountable haptic actuator further includes a stationary conductive coil positioned within the interior chamber proximate the movable magnetic weight structure and a plurality of conductive terminals extending through the housing and in electrical contact with the conductive coil.

14 Claims, 25 Drawing Sheets

238

204

208

240

218a

220

220

300

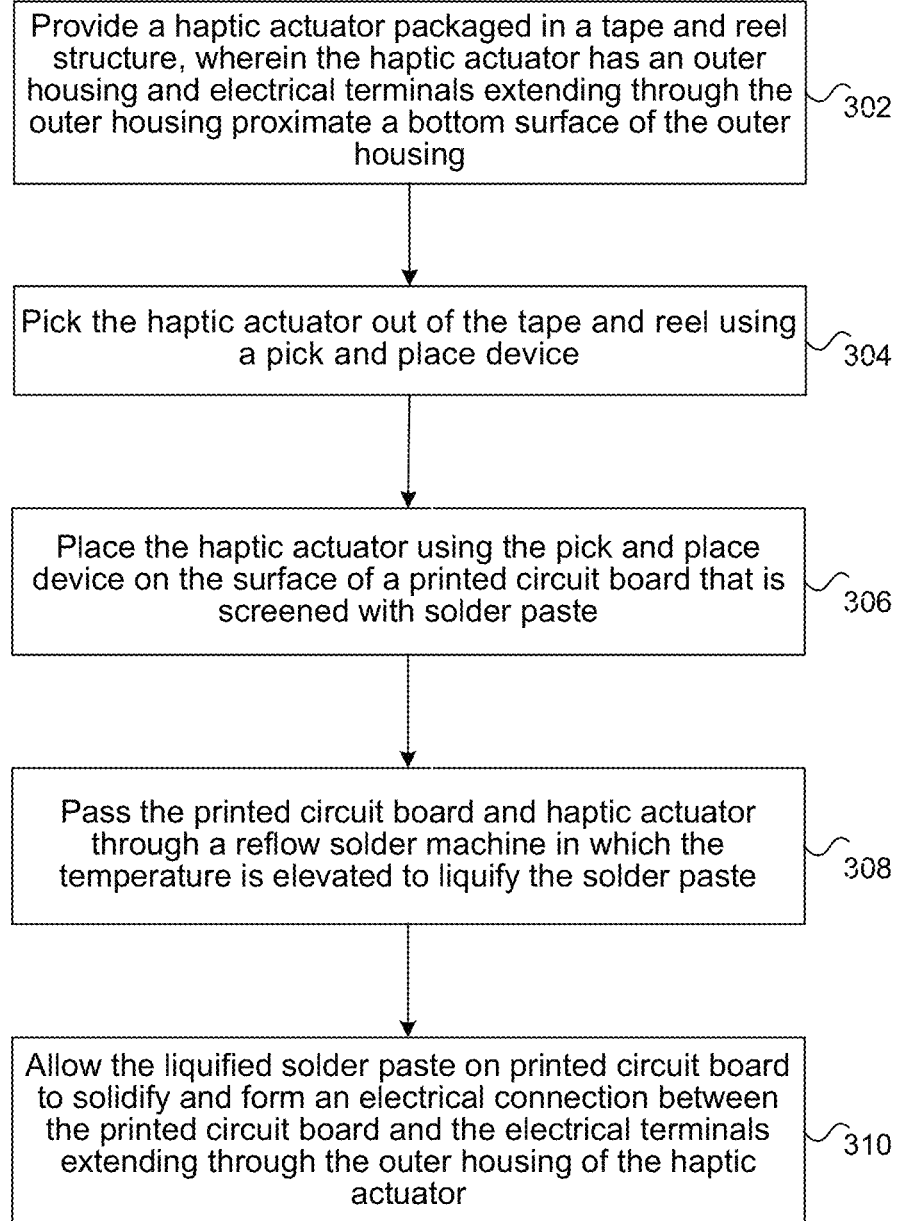

Provide a haptic actuator packaged in a tape and reel structure, wherein the haptic actuator has an outer housing and electrical terminals extending through the outer housing proximate a bottom surface of the outer housing    302

Pick the haptic actuator out of the tape and reel using a pick and place device    304

Place the haptic actuator using the pick and place device on the surface of a printed circuit board that is screened with solder paste    306

Pass the printed circuit board and haptic actuator through a reflow solder machine in which the temperature is elevated to liquify the solder paste    308

Allow the liquified solder paste on printed circuit board to solidify and form an electrical connection between the printed circuit board and the electrical terminals extending through the outer housing of the haptic actuator    310

FIG. 3

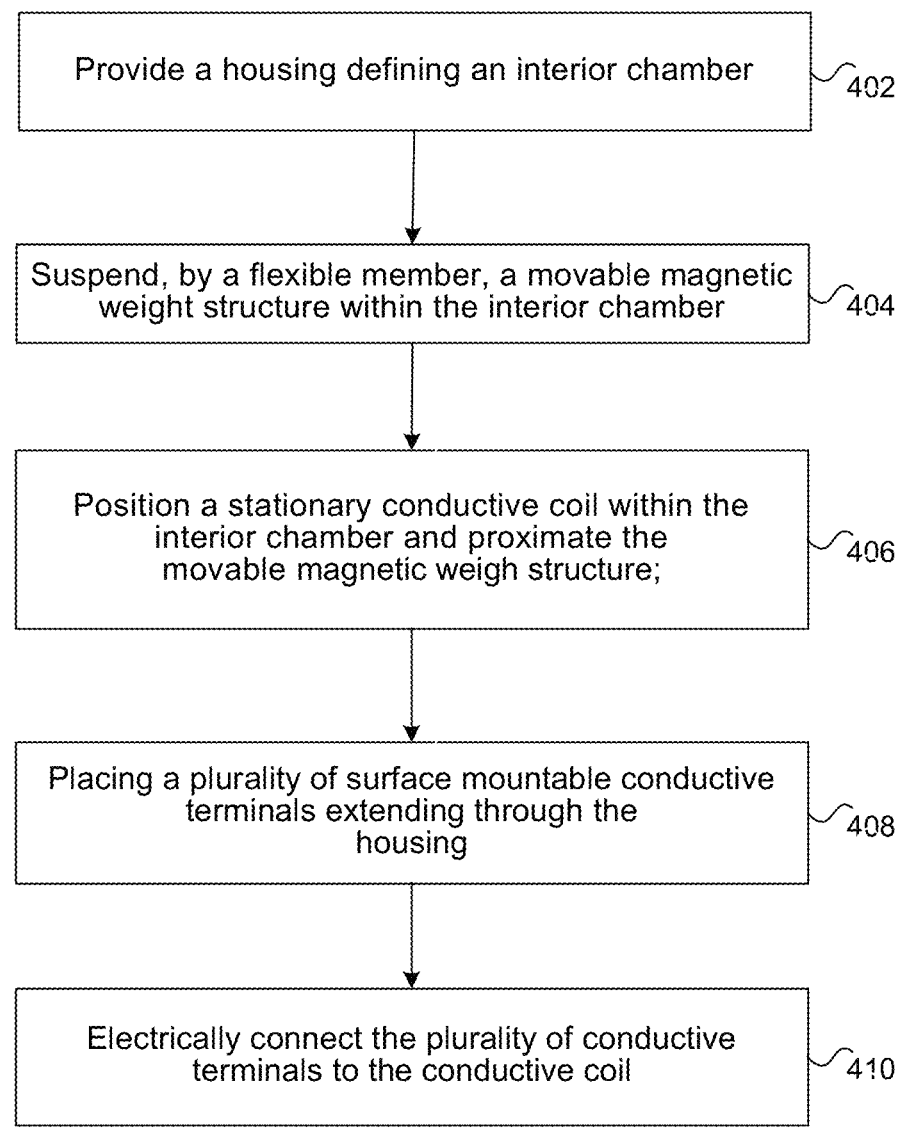

400

Provide a housing defining an interior chamber — 402

Suspend, by a flexible member, a movable magnetic weight structure within the interior chamber — 404

Position a stationary conductive coil within the interior chamber and proximate the movable magnetic weigh structure; — 406

Placing a plurality of surface mountable conductive terminals extending through the housing — 408

Electrically connect the plurality of conductive terminals to the conductive coil — 410

FIG. 4

SURFACE MOUNT HAPTIC ACTUATOR

TECHNICAL FIELD

The present disclosure generally relates to a haptic actuator configured for use in surface mount applications.

BACKGROUND

Existing haptic actuators enable devices to provide tactile or vibration feedback to communicate with a user of a device. However, existing haptic actuators may not facilitate use in applications associated with small packaging requirements related to devices associated with sizing constraints.

SUMMARY

Various implementations disclosed herein include devices, systems, and methods that implement a surface mount haptic actuator providing multiple types and ranges of tactile or vibrational feedback in combination with or in place of audible feedback for user acknowledgement with respect to touch-based functionality. A haptic actuator may comprise an electro/mechanical device that provides tactile or vibration feedback for devices such as, inter alia, a smartphone, a smartwatch, a video game controller, a touch display, medical equipment, etc. The tactile or vibration feedback may comprise a touch based tactile or vibration feedback.

In some implementations, a surface mount haptic actuator comprises a movable counterweight providing vibrational functionality for the surface mount haptic actuator. The movable counterweight may be attached to a suspension ring suspending the movable counterweight over a stationary coil thereby allowing for a compact design and robust surface mount haptic actuator construction.

In some implementations, a surface mount haptic actuator may utilize surface mount technology such that connection wires connecting surface mount terminals to the stationary coil may be internally soldered or spot welded to (tin or gold-plated) the surface mount terminals that exit the surface mount haptic actuator via a lower housing. Utilizing surface mount technology enables the surface mount haptic actuator to be soldered directly to a printed circuit board (PCB) in combination with additional electrical components (of the PCB) to mechanically and electrically connect the surface mount haptic actuator to the PCB.

In some implementations, a surface mount haptic actuator is configured to be manufactured in a variety of sizes via automated manufacturing processes.

In some implementations, vibrational characteristics of a surface mount haptic actuator may be varied during operation thereby providing multiple feedback options. Likewise, a surface mount haptic actuator may comprise a sealed apparatus to enable waterproof characteristics.

In some implementations, a haptic actuator comprises a housing defining an interior chamber; a movable magnetic weight structure suspended within the interior chamber by a flexible member; a stationary conductive coil positioned within the interior chamber proximate the movable magnetic weigh structure; and a plurality of conductive terminals extending through the housing and in electrical contact with the conductive coil.

In some implementations, a method of mounting a haptic actuator on the surface of a printed circuit board is provided. The method performs one or more steps or processes. In some implementations, a haptic actuator packaged in a tape and reel structure is provided. The haptic actuator may include an outer housing and electrical terminals extending through the outer housing proximate a bottom surface of the outer housing. In some implementations, the haptic actuator is picked out of the tape and reel using a pick and place device. In some implementations, the haptic actuator is placed, using the pick and place device, on the surface of a printed circuit board that is screened with solder paste. In some implementations, the printed circuit board and haptic actuator are passed through a reflow solder machine in which the temperature is elevated to liquify the solder paste. In some implementations, the liquified solder paste on printed circuit board is allowed to solidify and form an electrical connection between the printed circuit board and the electrical terminals extending through the outer housing of the haptic actuator.

In some implementations, a method of making a haptic actuator is provided. The method performs one or more steps or processes. In some implementations, a housing defining an interior chamber is provided. In some implementations, a movable magnetic weight structure is suspended within the interior chamber by a flexible member. In some implementations, a stationary conductive coil is positioned within the interior chamber and proximate the movable magnetic weigh structure. In some implementations, a plurality of surface mountable conductive terminals are placed extending through the housing. In some implementations, the plurality of conductive terminals are electrically connected to the conductive coil.

In accordance with some implementations, a device includes one or more processors, a non-transitory memory, and one or more programs; the one or more programs are stored in the non-transitory memory and configured to be executed by the one or more processors and the one or more programs include instructions for performing or causing performance of any of the methods described herein. In accordance with some implementations, a non-transitory computer readable storage medium has stored therein instructions, which, when executed by one or more processors of a device, cause the device to perform or cause performance of any of the methods described herein. In accordance with some implementations, a device includes: one or more processors, a non-transitory memory, and means for performing or causing performance of any of the methods described herein.

BRIEF DESCRIPTION OF THE DRAWINGS

So that the present disclosure can be understood by those of ordinary skill in the art, a more detailed description may be had by reference to aspects of some illustrative implementations, some of which are shown in the accompanying drawings.

FIG. 3 is a flowchart representation of an exemplary method for mounting a haptic actuator on a surface of a printed circuit board.

FIG. 4 is a flowchart representation of an exemplary method for making a haptic actuator, in accordance with some implementations.

Figure 1A:
FIG. 1A illustrates a front cut-away view of a surface mount haptic actuator configured to provide tactile or vibrational feedback, in accordance with some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DESCRIPTION

Numerous details are described in order to provide a thorough understanding of the example implementations shown in the drawings. However, the drawings merely show some example aspects of the present disclosure and are therefore not to be considered limiting. Those of ordinary skill in the art will appreciate that other effective aspects and/or variants do not include all of the specific details described herein. Moreover, well-known systems, methods, components, devices, and circuits have not been described in exhaustive detail so as not to obscure more pertinent aspects of the example implementations described herein.

FIG. 1A illustrates a front cut-away view 102a of a surface mount haptic actuator 100 configured to provide tactile or vibrational feedback, in accordance with some implementations. Surface mount haptic actuator 100 comprises an electro/mechanical device that provides a tactile or vibration feedback for devices such as, inter alia, a smartphone, a smartwatch, a video game controller, a touch display, medical equipment, etc. in response to user touch. Surface mount haptic actuator 100 utilizes surface mount technology for use in a variety of applications in place of or in combination with audio feedback functionality. Typical haptic actuators require a coil to be attached to a suspension ring with a counterweight proximate a stationary magnet. In contrast, surface mount haptic actuator 100 comprises a movable magnet attached to a suspension ring suspending the movable magnet over a stationary coil.

Typical haptic actuators are electrically connected, via manual soldering processes, to associated circuitry using lead wires and manual soldering, which may be labor intensive. In contrast, surface mount haptic actuator 100 comprises an improved haptic actuator design associated with surface mounting (to a PCB) processes that eliminate the need for wires and manual soldering processes. Likewise, surface mount haptic actuator 100 utilizes surface mount technology such that connection wires (within surface mount haptic actuator 100) may be internally soldered and/or spot welded to surface mount terminals (e.g., terminals 120 as illustrated and described with respect to FIG. 1C, infra) that exit through a housing (e.g., housing 118 as described, infra) such that they are positioned horizontal to a bottom surface of the housing. The terminal may comprise a metallic material such as, inter alia, tin, a gold-plated material, etc. Utilizing surface mount technology enables surface mount haptic actuator to be soldered directly to a PCB in combination with additional electrical components being mounted to the PCB thereby eliminating the need for usage of double-sided tape, glue, heat staking, or pinching to the housing to hold surface mount haptic actuator 100 in place. Surface mount haptic actuator 100 comprises components enabling the structure to be manufactured in a variety of sizes ranging from large to very small surface mount applications. Likewise, surface mount haptic actuator 100 comprises components enabling the structure to be constructed and mounted (e.g., to a PCB) via automated manufacturing processes.

In some implementations, vibrational characteristics (of surface mount haptic actuator 100) may be varied during operation to enable multiple feedback options. Likewise, surface mount haptic actuator 100 may be sealed (e.g., using an epoxy substance) for ingress protection thereby creating a waterproof structure.

Surface mount haptic actuator 100 comprises a lower housing 118 comprising a molded/integrated yoke plate 118c, a coil 116 (e.g., an electromagnetic coil comprising windings), a counterweight 125, a vibrating plate 108, and an upper housing 104. Counterweight 125 comprises a structure formed from a T-iron 109, a magnet 112, and a pole piece 114. Coil 116 comprises a stationary coil placed or wrapped around yoke plate 118c. Coil 118c may be integrated with lower housing 118 and molded/integrated yoke plate 118c. Likewise, coil 118c may be electrically connected to surface mount terminals (e.g., surface mount terminals illustrated in FIG. 1C, infra) extending through lower housing 118 for providing an external surface mount connection (electrical and mechanical) to a PCB providing operational functionality for surface mount haptic actuator 100.

Upper housing 104 may be an upper housing plate comprising a metallic material. Vibrating plate 108 (e.g., a flexible member such as a specialized spring) may be mechanically attached to upper housing 104 via, inter alia, a weld structure formed via a welding process. Likewise, counterweight 125 (e.g., a movable magnetic weight structure) may be mechanically attached to upper housing 104 via vibrating plate 108 such that counterweight 125 is suspended above coil 116 within an interior chamber of lower housing 118 by vibrating plate 108. Vibrating plate 108 may comprise any type of structure including, inter alia, a laser cut or stamped structure formed from, inter alia, stainless steel, aluminum, brass, plastic, fiber, etc. such that vibrating plate 108 comprises a flexible structure configured to permit repeated movement or cycling of counterweight 125 without mechanical failure. Counterweight 125 may be mechanically attached to vibrating plate 108 via, for example, a spot-welding process. Likewise, a portion(s) of vibrating plate 108 may be molded within and/or spot welded to upper housing 104.

Upper housing 104 and lower housing 118 may be mechanically coupled via ultrasonic welding and/or adhesive processes. Surface mount haptic actuator 100 may comprise a sealed structure (e.g., using an epoxy substance) thereby increasing shock resistance and preventing water ingress.

Surface mount haptic actuator 100 is operable such that when an alternating current (AC) signal (voltage) is applied to coil 116, a varying magnetic field is created causing counterweight 125 to move up and down quickly thereby creating a tactile (vibrational) sensation emulating from surface mount haptic actuator 100. Modifying a drive voltage and/or frequency level of the AC signal may increase or decrease an amount or level of the tactile (vibrational) sensation. Additionally, modifying the shape, size, or weight of counterweight 125 and/or modifying the size or shape of vibrating plate 108 may increase or decrease an amount of tactile (vibration) sensation. In some implementations, overall dimensions of surface mount haptic actuator 100 may be equal to or less than 25 millimeters (mm)×25 mm×25 mm. For example, surface mount haptic actuator 100 may comprise dimensions (e.g., length, width, and height dimensions) selected from a range of about 2 mm to about 25 mm.

In some implementations, structures that include surface mount haptic actuator(s) (e.g., PCBs of devices such as, inter alia, a smartphone, a smartwatch, a video game controller, a touch display, medical equipment, etc.) may be assembled by packaging multiple surface mount haptic actuators within a tape & reel such that a pick & place machine may be used for automatically picking the surface mount haptic actuator (s) out of the tape and placing them directly onto a PCB that has been screened with solder paste (e.g., lead free solder). Subsequent to all components (e.g., a surface mount haptic actuator(s) and additional components of the PCB) being placed on the PCB, the PCB may be placed within a reflow solder apparatus on a conveyor belt to bake the solder paste into liquid solder. When the liquid solder cools below a threshold temperature, it solidifies on and over surface mount terminals (of each surface mount haptic actuator) thereby creating an electrical connection to the electronic components on the PCB. Likewise, the solidified solder creates a mechanical connection between the surface mount haptic actuator(s) and the PCB. In some implementations, the reflow solder machine may be set to ramp up to temperatures between a range of about 240 C to about 260 C for a time frame of about 5-10 seconds and subsequently ramp the temperatures back down to an original temperature range. Therefore, surface mount haptic actuators may be manufactured with materials that are able to withstand the aforementioned high temperatures.

For example, various components of surface mount haptic actuator may be constructed from the following materials:

| Component | Material |
|---|---|
| Lower housing 118 | Liquid crystal polymer (LCP) and steel such, inter alia, as SUS 301 grade steel |
| Upper housing 104 | Stainless steel such as, inter alia, SUS 304 grade steel |
| T-iron 109 | SPCC steel |
| Magnet 112 | Iron core, neodymium, ferrite, or cobalt |
| Pole piece 114 | SPCC steel |
| Coil 116 windings | Copper wire |
| Terminals 120 | Tin or Gold-plated copper or phosphor bronze |
| Potting | High temperature RTV, epoxy, glue |
| Solder | Lead free high temperature solder |
| Vibrating plate 108 | Stainless Steel, aluminum, brass, plastic, flexible fiber, etc. |

The terms "upper" and "lower" are used herein for convenience to identify certain structural elements as they are depicted in the various Figures. However, it should be understood that these descriptors are in no way intended to be limitations on the scope of the invention. Depending on the orientation in which the surface mount haptic actuator is mounted in a larger device, the "upper housing" or "upper housing assembly" may in fact be located below or in a lower position than the "lower housing" or the "lower housing assembly." These embodiments are contemplated and intended to be covered by the disclosure and claims provided herein.

Figure 1B:
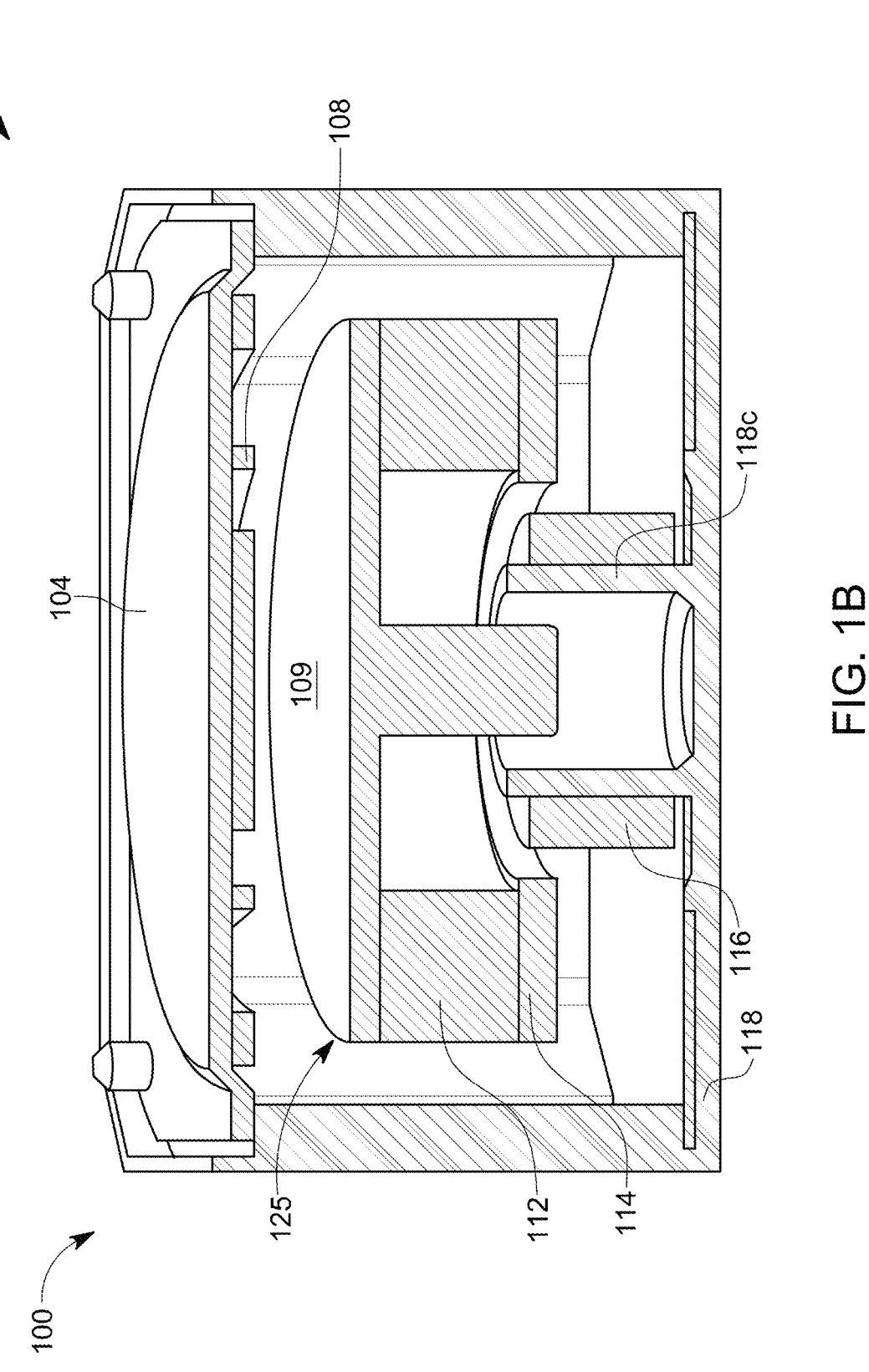
FIG. 1B illustrates a front cut-away tilted view of the surface mount haptic actuator of FIG. 1A, in accordance with some implementations.

FIG. 1B illustrates a front cut-away tilted view 102b of surface mount haptic actuator 100 of FIG. 1A, in accordance with some implementations. Front cut-away tilted view 102b illustrates a 3D appearance illustrating a shape of lower housing 118, molded/integrated yoke plate 118c, coil 116, counterweight 125, vibrating plate 108, and upper housing 104 of surface mount haptic actuator 100.

Figure 1C:
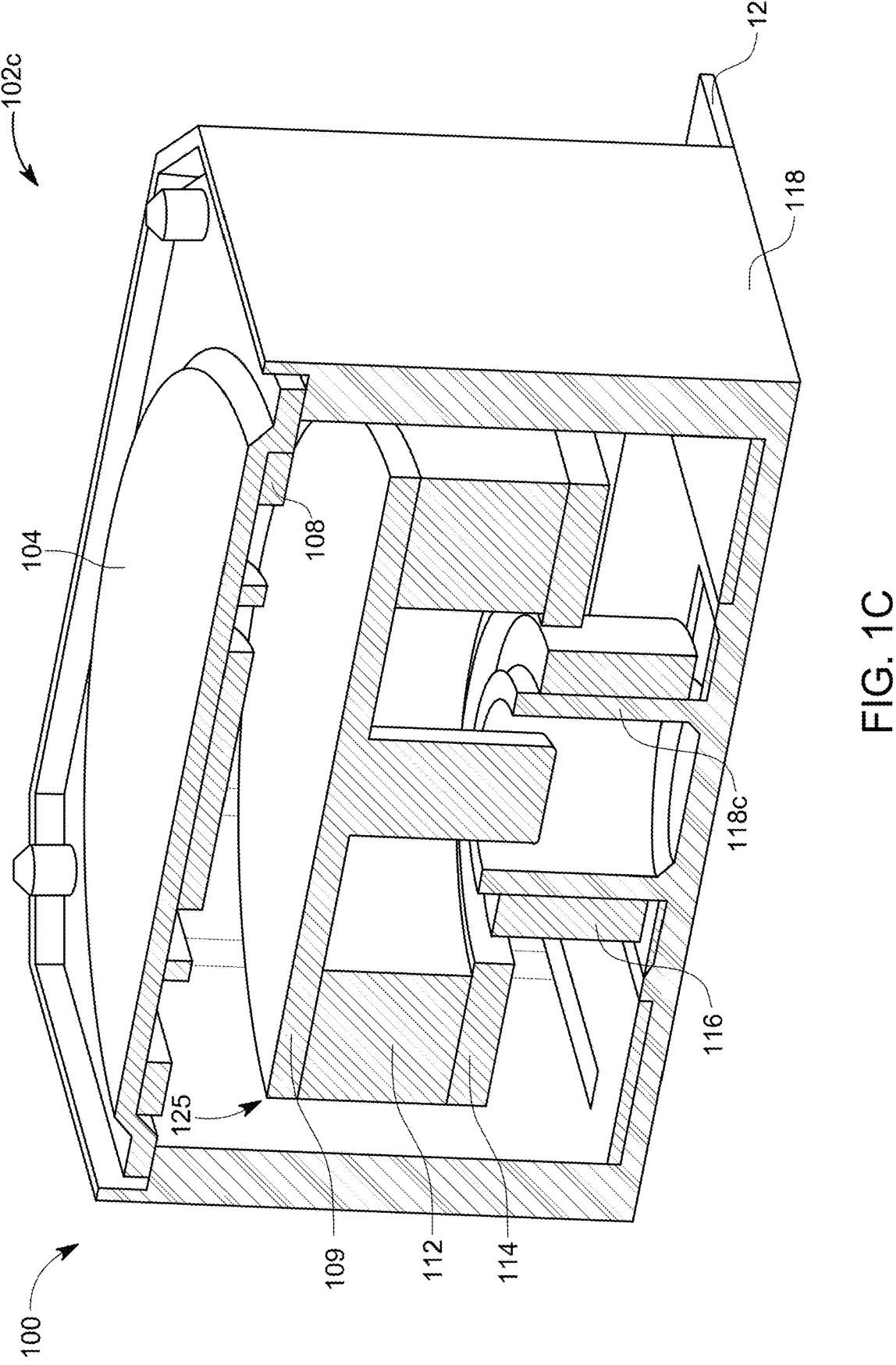
FIG. 1C illustrates a front cut-away isometric view of the surface mount haptic actuator of FIG. 1A, in accordance with some implementations.

FIG. 1C illustrates a front cut-away isometric view 102c of surface mount haptic actuator 100 of FIG. 1A, in accordance with some implementations. Front cut-away isometric view 102c additionally illustrates one of surface mount terminals 120 for electrically and mechanically connecting surface mount haptic actuator 100 (and associated internal components such as, inter alia, coil 116) to a PCB. Surface mount haptic actuator 100 may comprise multiple surface mount terminals 120 located at various positions with respect to lower housing 118 (e.g., as illustrated with respect to FIG. 1L, infra). As described with respect to FIG. 1A, connection wires (within surface mount haptic actuator 100) may be internally soldered and/or spot welded to surface mount terminal(s) 120 extending through housing 118 such that they are positioned horizontal to a bottom surface of housing 118. Surface mount terminal 120 may comprise a metallic material such as, inter alia, tin, a gold-plated material, etc.

Figure 1D:
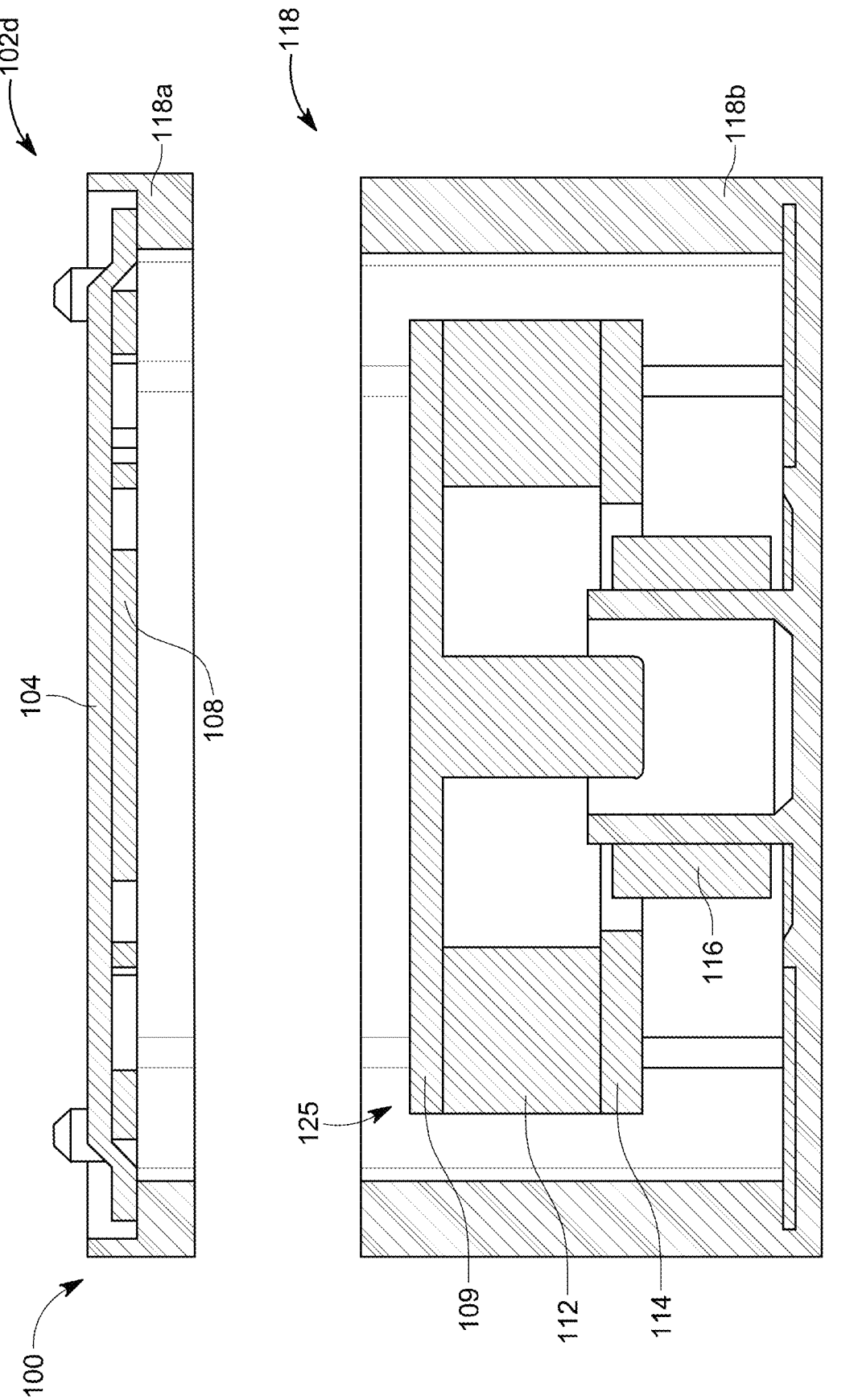
FIG. 1D illustrates a floating front cut-away view of the surface mount haptic actuator of FIG. 1A, in accordance with some implementations.

FIG. 1D illustrates a floating front cut-away view 102*d* of surface mount haptic actuator 100 of FIG. 1A, in accordance with some implementations. Floating front cut-away view 102*d* (and FIGS. 1E-1I, infra) illustrates lower housing 118 as separate component views 118*a* and 118*b* for illustration purposes to better illustrate components of surface mount haptic actuator 100. Note that lower housing 118 comprises a single structure that includes a combination of component views 118*a* and 118*b*.

Figure 1E:
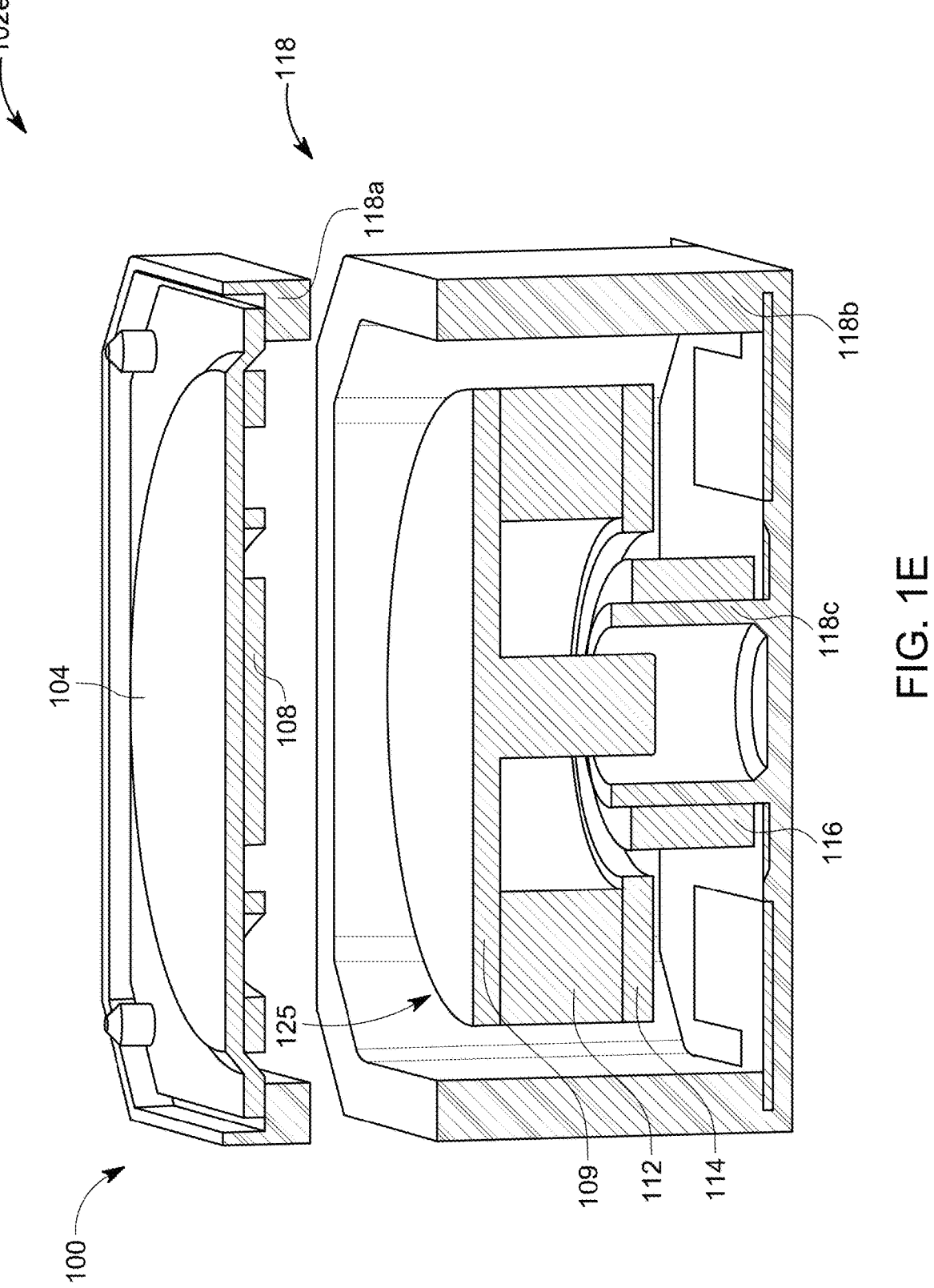
FIG. 1E illustrates a floating front cut-away tilted view of the surface mount haptic actuator of FIG. 1A, in accordance with some implementations.

FIG. 1E illustrates a floating front cut-away tilted view 102*e* of surface mount haptic actuator 100 of FIG. 1A, in accordance with some implementations.

Figure 1F:
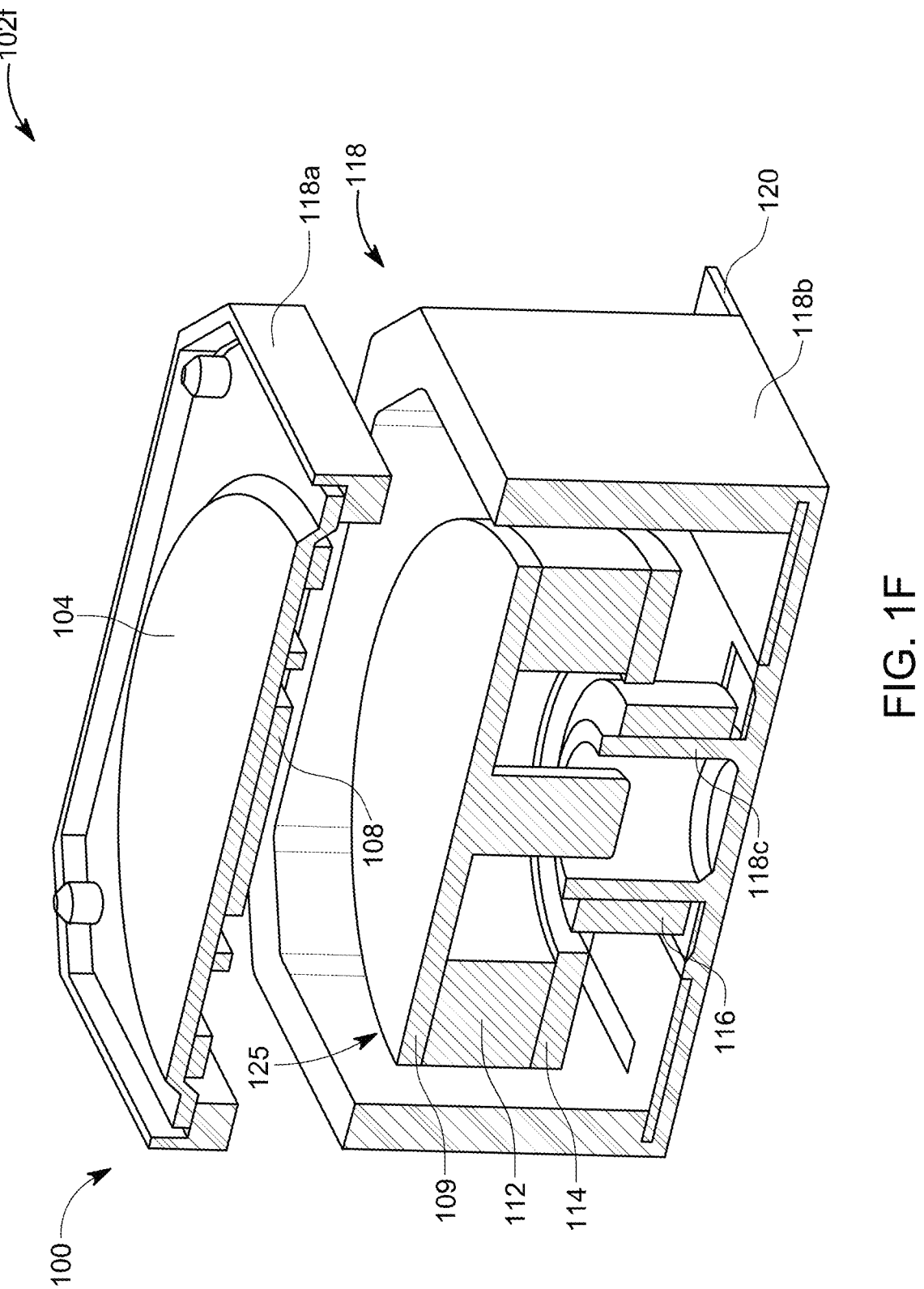
FIG. 1F illustrates a floating front cut-away isometric view of the surface mount haptic actuator of FIG. 1A, in accordance with some implementations.

FIG. 1F illustrates a floating front cut-away isometric view 102*f* of surface mount haptic actuator 100 of FIG. 1A, in accordance with some implementations.

Figure 1G:
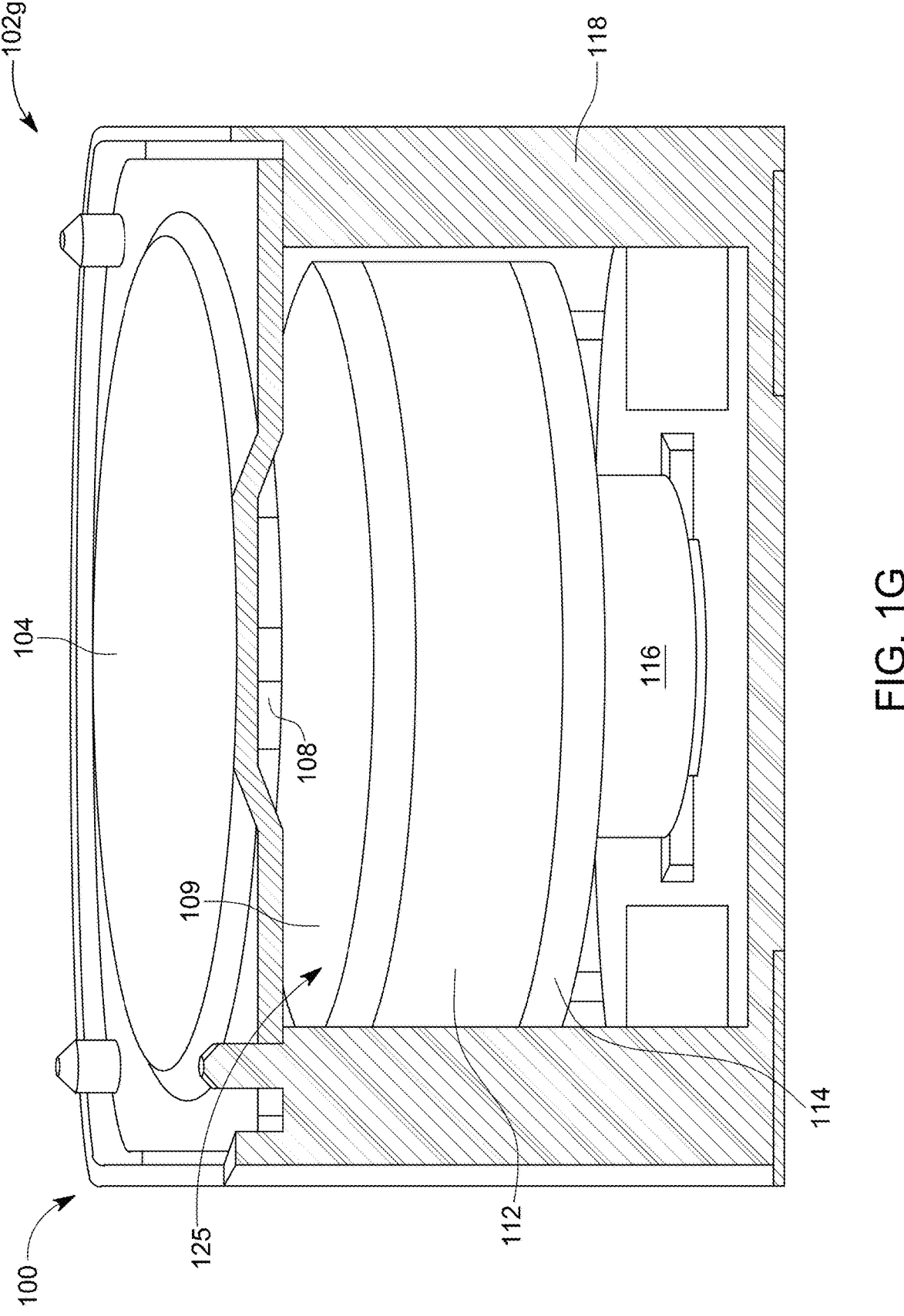
FIG. 1G illustrates a front tilted suspension-based view of the surface mount haptic actuator of FIG. 1A, in accordance with some implementations.

FIG. 1G illustrates a front tilted suspension-based view 102G of surface mount haptic actuator 100 of FIG. 1A, in accordance with some implementations. Front cut-away tilted suspension-based view 102G illustrates a front portion of lower housing 118 removed for further illustrating a shape of vibrating plate 108.

Figure 1H:
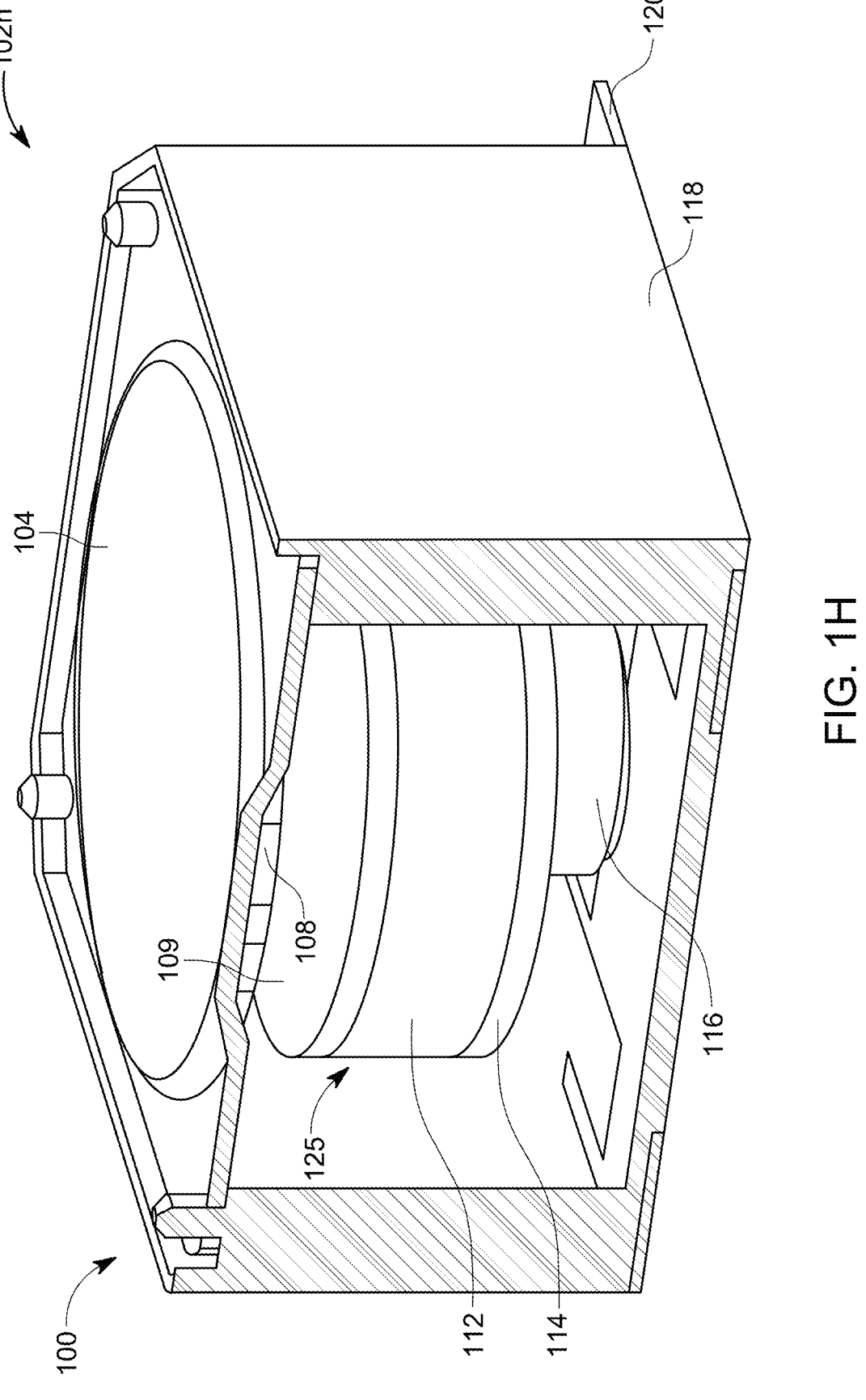
FIG. 1H illustrates an isometric suspension-based view of the surface mount haptic actuator of FIG. 1A, in accordance with some implementations.

FIG. 1H illustrates an isometric suspension-based view 102G of surface mount haptic actuator 100 of FIG. 1A, in accordance with some implementations.

Figure 1I:
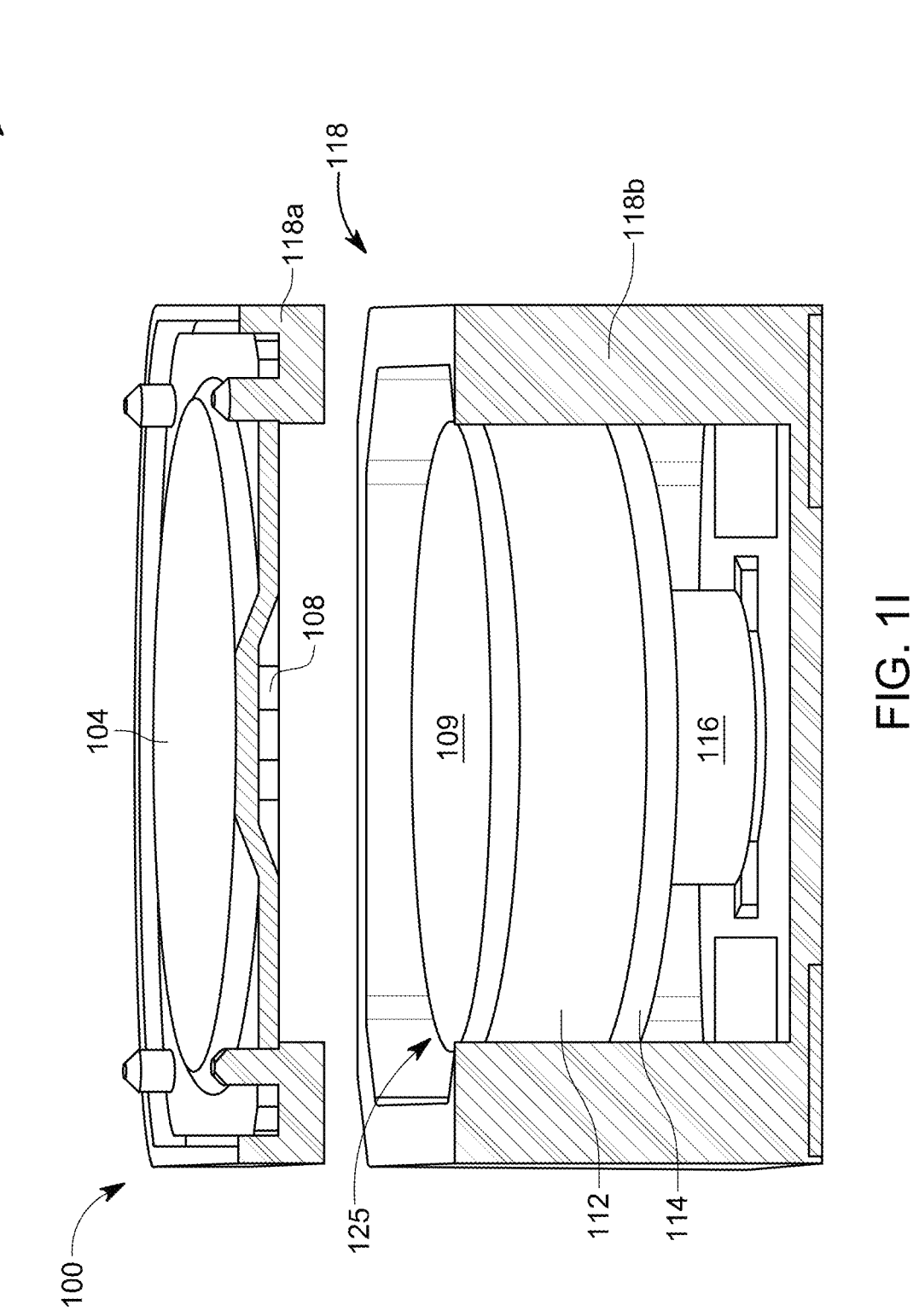
FIG. 1I illustrates a tilted suspension-based view of the surface mount haptic actuator of FIG. 1A, in accordance with some implementations.

FIG. 1I illustrates a tilted suspension-based view 102I of surface mount haptic actuator 100 of FIG. 1, in accordance with some implementations.

Figure 1J:
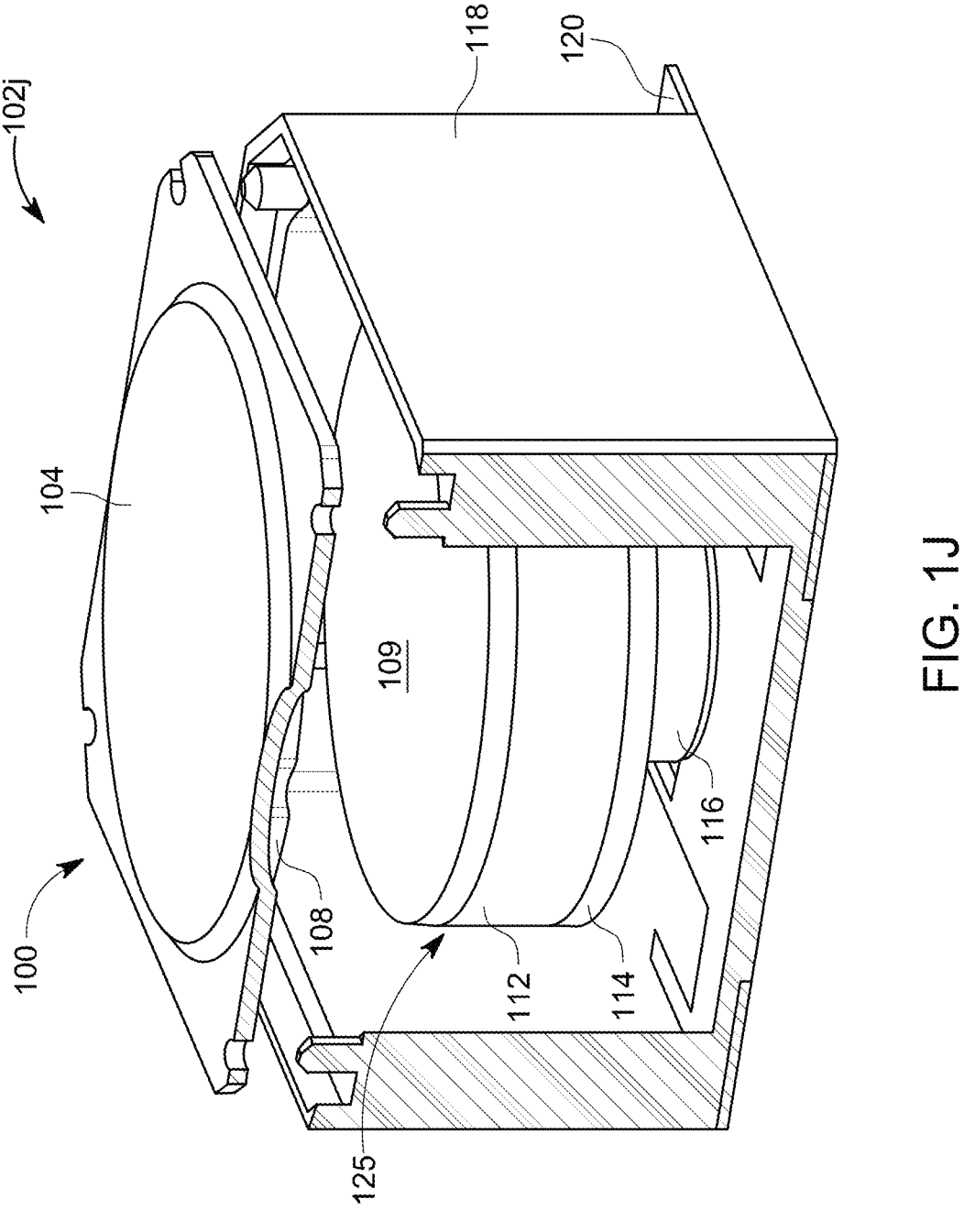
FIG. 1J illustrates a front isometric suspension-based view of the surface mount haptic actuator of FIG. 1A, in accordance with some implementations.

FIG. 1J illustrates a front isometric suspension-based view 102J of surface mount haptic actuator 100 of FIG. 1A, in accordance with some implementations. Front isometric suspension-based view 102J illustrates upper housing (plate) 104 removed from lower housing 118.

Figure 1K:
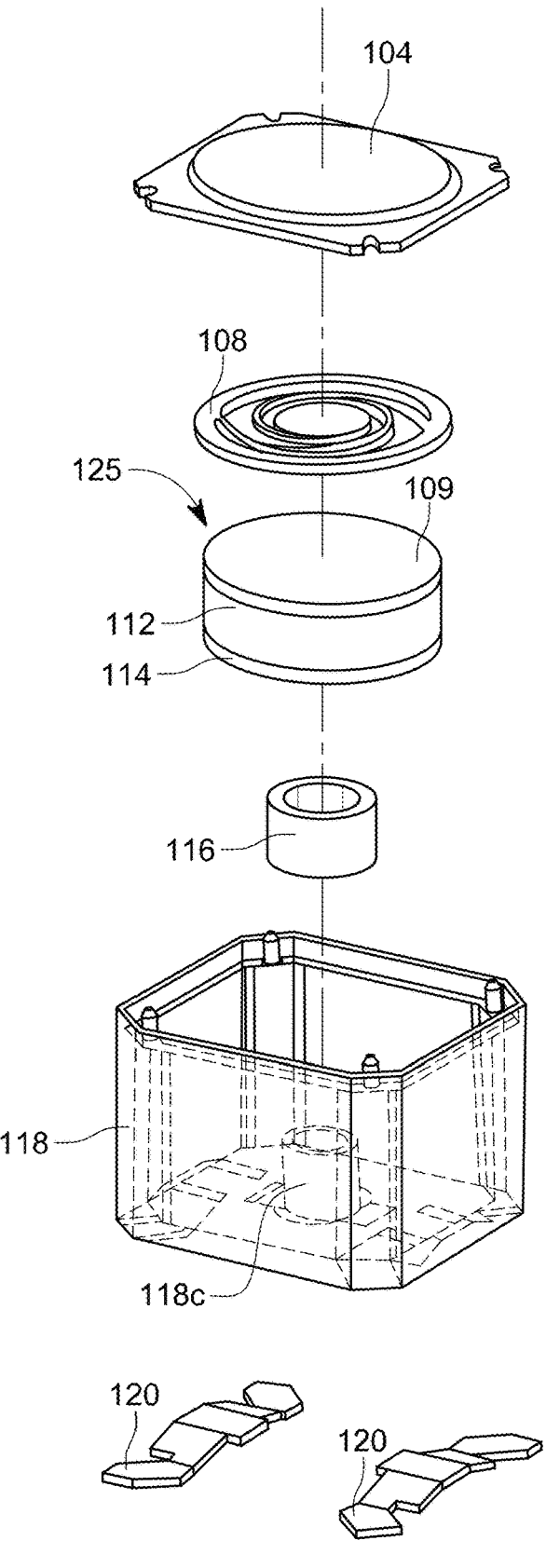
FIG. 1K illustrates an exploded view of the surface mount haptic actuator of FIG. 1A, in accordance with some implementations.

FIG. 1K illustrates an exploded view of surface mount haptic actuator 100 of FIG. 1A, in accordance with some implementations. Exploded view 102K illustrates a 3D appearance independently illustrating lower housing 118, molded/integrated yoke plate 118*c*, coil 116, counterweight 125, vibrating plate 108, upper housing 104, and terminals 120 of surface mount haptic actuator 100.

Figure 1L:
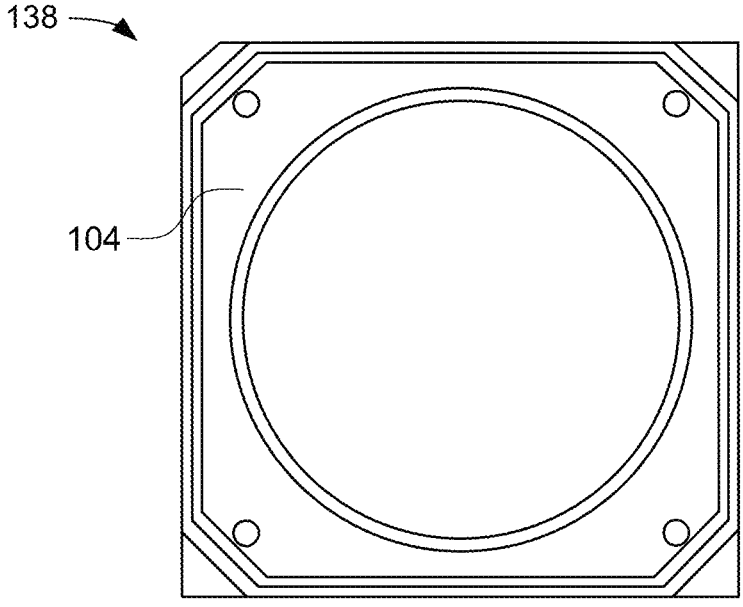
FIG. 1L illustrates a top view of the upper housing and a bottom view of the lower housing of the surface mount haptic actuator of FIG. 1A, in accordance with some implementations.
Figure 1L:
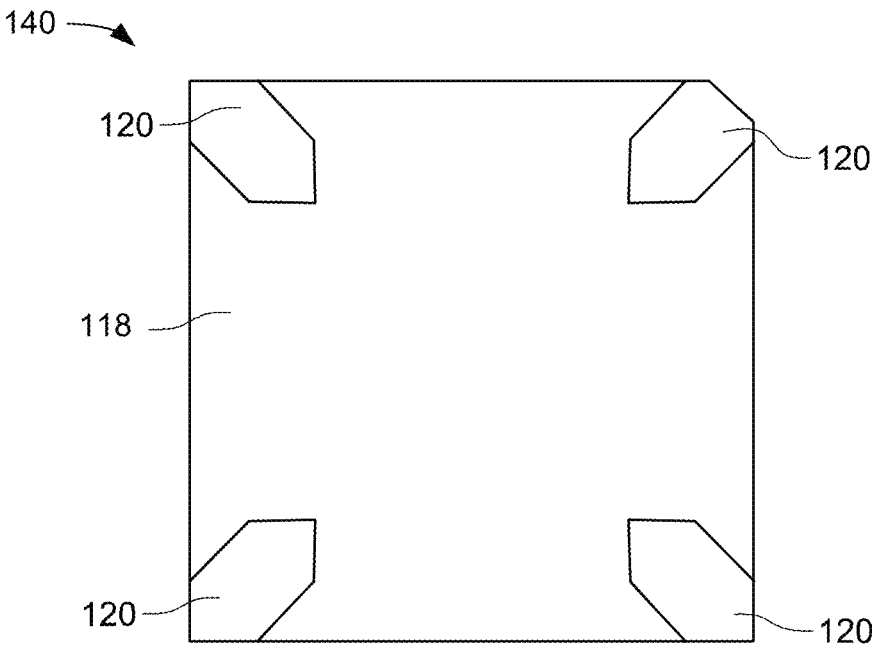

FIG. 1L illustrates a top view 138 of upper housing (plate) 104 and a bottom view 140 of lower housing 118 of surface mount haptic actuator 100 of FIG. 1A, in accordance with some implementations. Bottom view 140 of lower housing 118 illustrates an example of positioning and placement of terminals 120 with respect to lower housing 118. Although FIG. 1L illustrates a specified placement of terminals 120 with respect to lower housing 118, it may be noted that alternative placement and/or positioning of terminals may be used.

Figure 1M:
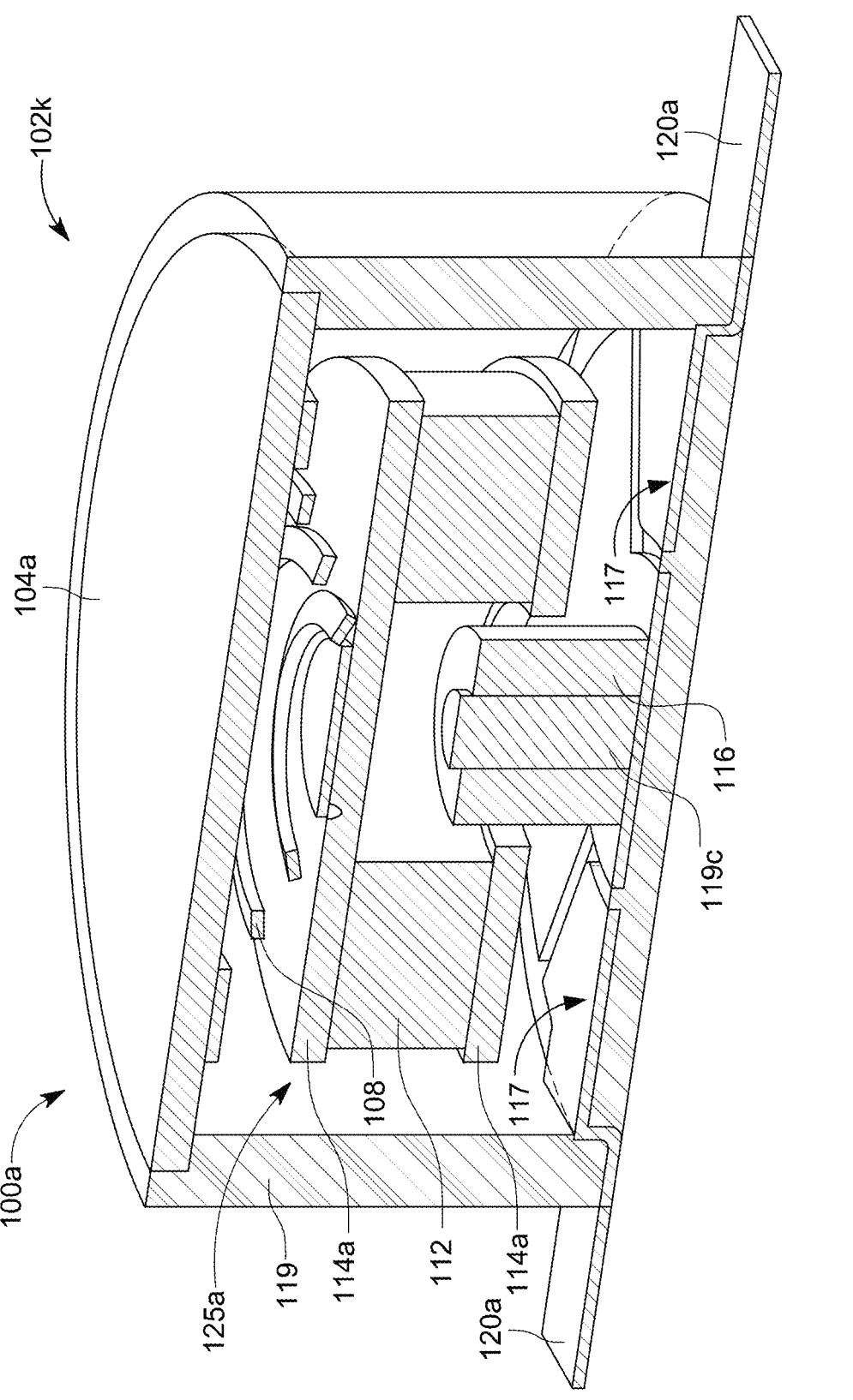
FIG. 1M illustrates a front cut-away isometric view of an alternative to the surface mount haptic actuator of FIG. 1A, in accordance with some implementations.

FIG. 1M illustrates a front cut-away isometric view 102*k* of an alternative surface mount haptic actuator 100*a* with respect to surface mount haptic actuator 100 of FIG. 1A, in accordance with some implementations. In contrast to surface mount haptic actuator 100 of FIG. 1A, surface mount haptic actuator 100*a* of FIG. 1M comprises an upper housing 104*a* and a lower housing 119 comprising a rounded or circular shape. Lower housing 119 comprises a yoke plate 119*c* (comprising an iron core) and coil 116 (e.g., an electromagnetic coil comprising windings). Surface mount haptic actuator 100*a* further comprises a counterweight 125*a* and vibrating plate 108. Counterweight 125*a* comprises a structure formed from a pole piece(s) 114 surrounding a magnet 112. Coil 116 comprises a stationary coil placed or wrapped around yoke plate 118*c*. Coil 118*c* may be integrated with lower housing 118 and yoke plate 118*c*. Likewise, coil 118*c* may be electrically connected to surface mount terminals 120*a* (via conductive elements 117) extending through lower housing 119 for providing an external surface mount (solder) connection (electrical and mechanical) to a PCB providing operational functionality for surface mount haptic actuator 100*a*.

Figure 2A:
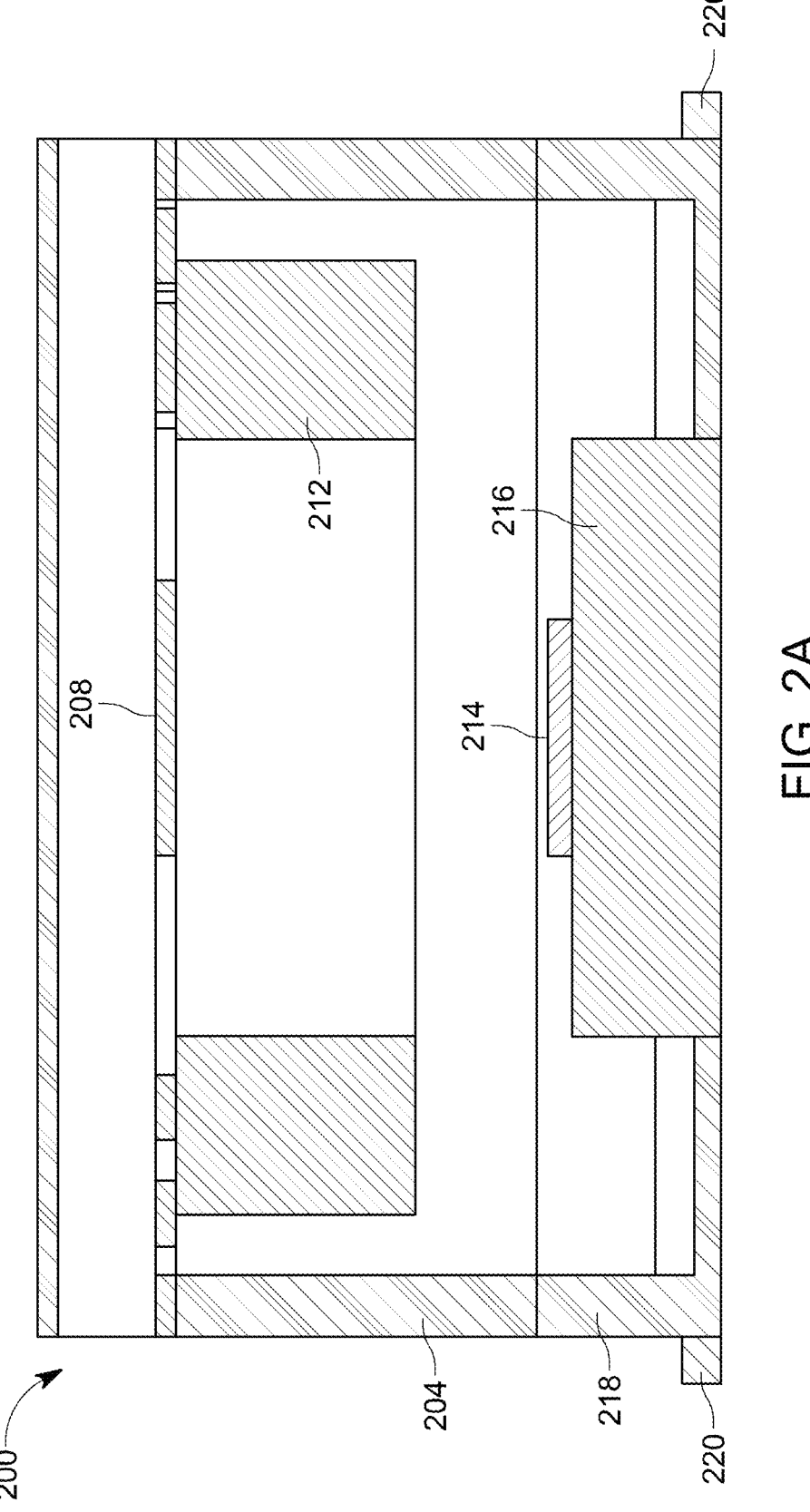
FIG. 2A illustrates a front cut-away view of an alternative surface mount haptic actuator configured to provide tactile or vibrational feedback, in accordance with some implementations.

FIG. 2A illustrates a front cut-away view 202*a* of a surface mount haptic actuator 200 configured to provide tactile or vibrational feedback, in accordance with some implementations. Surface mount haptic actuator 200 comprises an electro/mechanical device that provides a tactile or vibration feedback for devices such as, inter alia, a smartphone, a smartwatch, a video game controller, a touch display, medical equipment, etc. in response to user touch. Surface mount haptic actuator 200 utilizes surface mount technology for use in a variety of applications in place of or in combination with audio feedback functionality. Typical haptic actuators require a coil to be attached to a suspension ring with a counterweight proximate a stationary magnet. In contrast, surface mount haptic actuator 200 comprises a movable magnet attached to a suspension ring suspending the movable magnet over a stationary coil.

Surface mount haptic actuator 200 comprises an improved haptic actuator design associated with surface mounting (to a PCB) processes that eliminate the need for wires and manual soldering processes. Likewise, surface mount haptic actuator 200 utilizes surface mount technology such that connection wires (within surface mount haptic actuator 200) may be internally soldered and/or spot welded to surface mount terminals 220 that exit through a lower housing (e.g., lower housing 218 as described, infra) such that they are positioned horizontal to a bottom surface of the lower housing. Terminals 220 may comprise a metallic material such as, inter alia, tin, a gold-plated material, etc. Utilizing surface mount technology enables surface mount haptic actuator 200 to be soldered directly to a PCB in combination with additional electrical components being mounted to the PCB thereby eliminating the need for usage of double-sided tape, glue, heat staking, or pinching to the housing to hold surface mount haptic actuator 200 in place. Surface mount haptic actuator 200 comprises components enabling the structure to be manufactured in a variety of sizes ranging from very large to very small surface mount applications. Likewise, surface mount haptic actuator 200 comprises components enabling the structure to be used in automated manufacturing processes.

In some implementations, vibrational characteristics (of surface mount haptic actuator 200) may be varied during operation to enable multiple feedback options. Likewise, surface mount haptic actuator 200 may be sealed (e.g., using an ultrasonic welding process and/or an adhesive, etc.) for ingress protection thereby creating a waterproof structure.

Surface mount haptic actuator 200 comprises a lower housing 218 and an upper housing 204. Lower housing 218 may be mechanically coupled to upper housing 204 via usage of an ultrasonic welding process and/or an adhesive, etc. Surface mount haptic actuator 200 further comprises a (discrete) yoke plate 214, a coil 216 (e.g., an electromagnetic coil comprising windings), a magnetic counterweight 212, and a suspension ring 208. Coil 216 comprises a stationary coil placed on or wrapped around yoke plate 214. Coil 216 may be integrated with yoke plate 214 and/or lower housing 218. Likewise, coil 216 may be electrically connected to surface mount terminals 220 extending through lower housing 218 for providing an external surface mount connection (electrical and mechanical) to a printed circuit board providing operational functionality for surface mount haptic actuator 200.

Upper housing 204 and lower housing 218 may be formed from an LCP material. Suspension ring 208 (e.g., a flexible member such as a specialized spring) may be mechanically attached to upper housing 204 via, inter alia, a weld structure formed via a welding process. Likewise, magnetic counterweight 212 (e.g., a movable magnetic weight structure) may be mechanically attached to upper housing 204 via suspension ring 208 such that magnetic counterweight 212 is suspended above coil 216 within an interior chamber of lower housing 218 by suspension ring 208. Suspension ring 208 may comprise any type of structure including, inter alia, a laser cut or stamped structure formed from, inter alia, stainless steel, aluminum, brass, plastic, fiber, etc. such that suspension ring 208 comprises a flexible structure (e.g., a spring like structure) configured to permit repeated movement or cycling of magnetic counterweight 212 without mechanical failure. Magnetic counterweight 212 may be mechanically attached to suspension ring 208 via, for example, a spot-welding process, a plastic welding process, etc. Likewise, a portion(s) of suspension ring 208 may be molded within and/or spot/plastic welded to upper housing 204.

Upper housing 204 and lower housing 218 may be mechanically attached to each other via ultrasonic welding and/or adhesive processes. Surface mount haptic actuator 200 may comprise a sealed structure (e.g., using an epoxy substance) thereby increasing shock resistance and preventing water ingress.

Surface mount haptic actuator 200 is operable such that when an alternating current (AC) signal (voltage) is applied to coil 216, a varying magnet field is created causing magnetic counterweight 212 to move up and down quickly thereby creating a tactile (vibrational) sensation emulating from surface mount haptic actuator 200. Modifying a drive voltage and/or frequency level of the AC signal may increase or decrease an amount or level of the tactile (vibrational) sensation. Additionally, modifying a shape, size, or weight of magnetic counterweight 212 and/or modifying a size or shape of suspension ring 208 may increase or decrease an amount of tactile (vibration) sensation. In some implementations, overall dimensions of surface mount haptic actuator 200 may be equal to or less than 25 mm×25 mm×25 mm.

In some implementations, structures that include surface mount haptic actuator(s) (e.g., PCBs of devices such as, inter alia, a smartphone, a smartwatch, a video game controller, a touch display, medical equipment, etc) may be assembled by packaging multiple surface mount haptic actuators within a tape & reel such that a pick & place machine may be used for automatically picking the surface mount haptic actuator(s) out of the tape and placing them directly onto a printed circuit board (PCB) that has been screened with solder paste. Subsequent to all components (e.g., a surface mount haptic actuator(s) and additional components of the PCB) being placed on the PCB, the PCB may be placed within a reflow solder apparatus on a conveyor belt to bake the solder paste into liquid solder. When the liquid solder cools below a threshold temperature, it solidifies on and over surface mount terminals (of each surface mount haptic actuator) thereby creating an electrical connection to the electronic components on the PCB. Likewise, the solidified solder creates a mechanical connection between the surface mount haptic actuator(s) and the PCB. In some implementations, the reflow solder machine may be set to ramp up to temperatures between a range of about 240 C to about 260 C for a time frame of about 5-10 seconds and subsequently ramp the temperatures back down to an original temperature range. Therefore, surface mount haptic actuators may be manufactured with materials that are able to withstand the aforementioned high temperatures.

For example, various components of surface mount haptic actuator may be constructed from the following materials:

| Component | Material |
|---|---|
| Lower housing 218 | Liquid crystal polymer (LCP) |
| Upper housing 204 | LCP |
| Yoke Plate 214 | Iron core |
| Magnetic counterweight 212 | Iron core, neodymium, ferrite, or cobalt |
| Coil windings | Enameled copper wire |
| Terminals 220 | Tin- or Gold-plated copper or phosphor bronze |
| Potting | High Temperature RTV, epoxy, glue, etc. |
| Solder | Lead Free High Temperature solder |
| Suspension Ring 208 | Stainless Steel, aluminum, brass, plastic, flexible fiber, etc. |

Figure 2B:
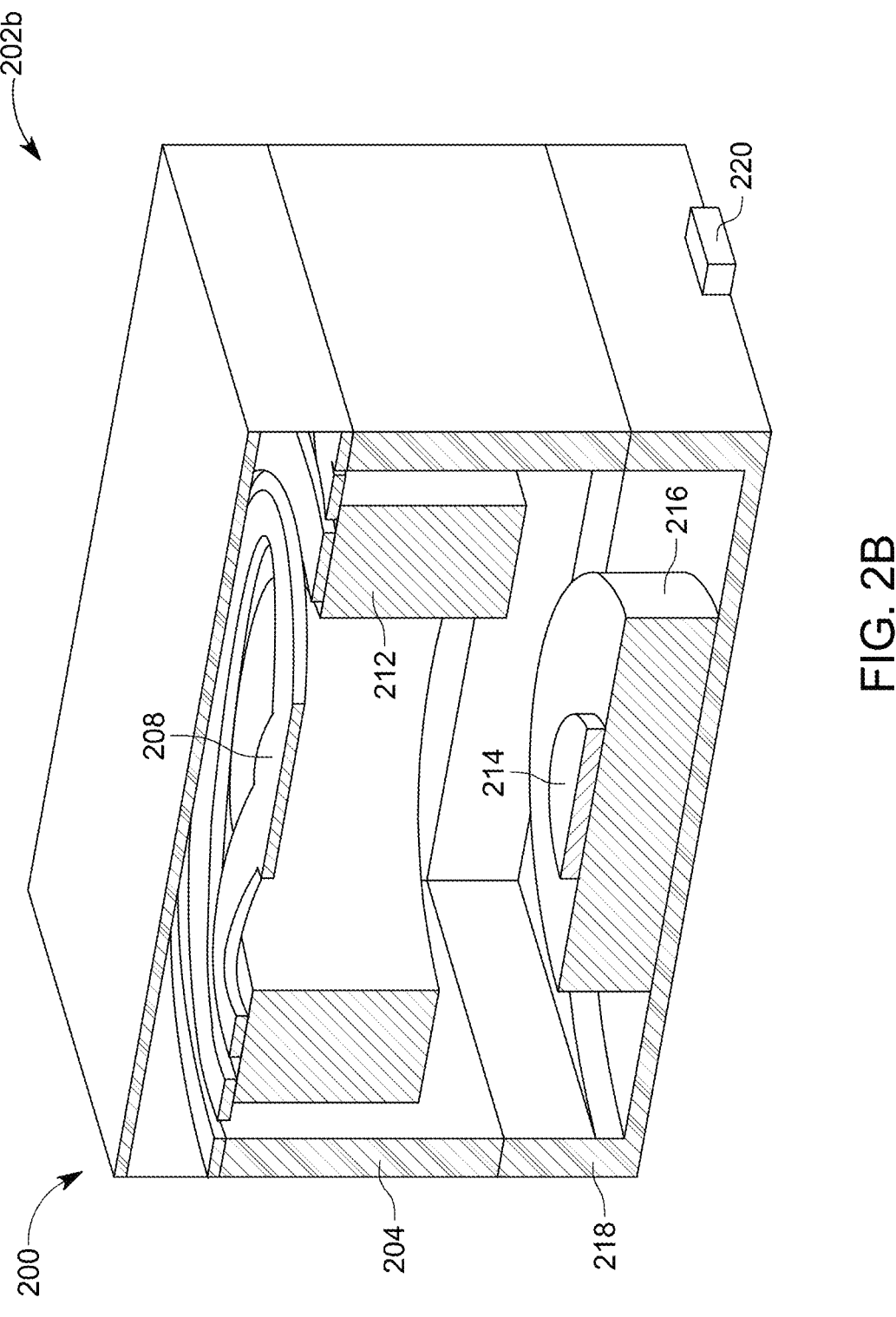
FIG. 2B illustrates a front cut-away isometric view of the surface mount haptic actuator of FIG. 2A, in accordance with some implementations.

FIG. 2B illustrates a front cut-away isometric view 202b of surface mount haptic actuator 200 of FIG. 2A, in accordance with some implementations. Front isometric view 202b illustrates a 3D appearance illustrating a shape of lower housing 218, yoke plate 214, coil 216, magnetic counterweight 212, suspension ring 208, and upper housing 204 of surface mount haptic actuator 200. Front isometric view 202b additionally illustrates surface mount terminals 220 for electrically and mechanically connecting surface mount haptic actuator 200 to a PCB. Surface mount haptic actuator 200 may comprise multiple surface mount terminals 220 located at various positions with respect to lower housing 218 (e.g., as illustrated with respect to FIG. 2J, infra). As described with respect to FIG. 2A, connection wires (within surface mount haptic actuator 200) may be internally soldered and/or spot welded to surface mount terminal(s) 220 extending through housing 218 such that they are positioned horizontal to a bottom surface of housing 218. Surface mount terminals 220 may comprise a metallic material such as, inter alia, tin, a gold-plated material, etc.

Figure 2C:
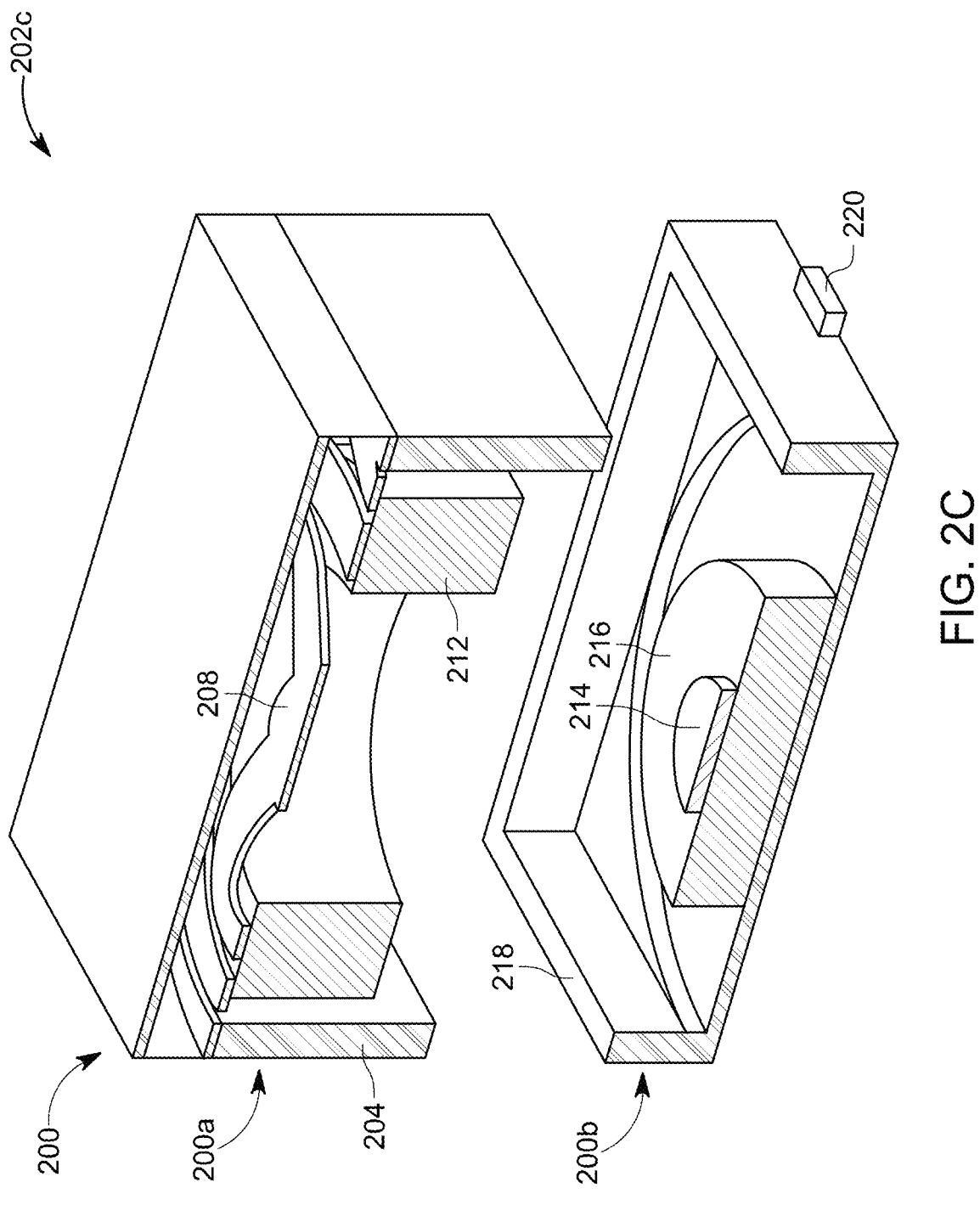
FIG. 2C illustrates a floating front cut-away isometric view of the surface mount haptic actuator of FIG. 2A, in accordance with some implementations.

FIG. 2C illustrates a floating front cut-away isometric view 202c of surface mount haptic actuator 200 of FIG. 2A, in accordance with some implementations. Floating front cut-away isometric view 202c additionally illustrates one of surface mount terminals 220 for electrically and mechanically connecting surface mount haptic actuator 200 to a PCB.

Figure 2D:
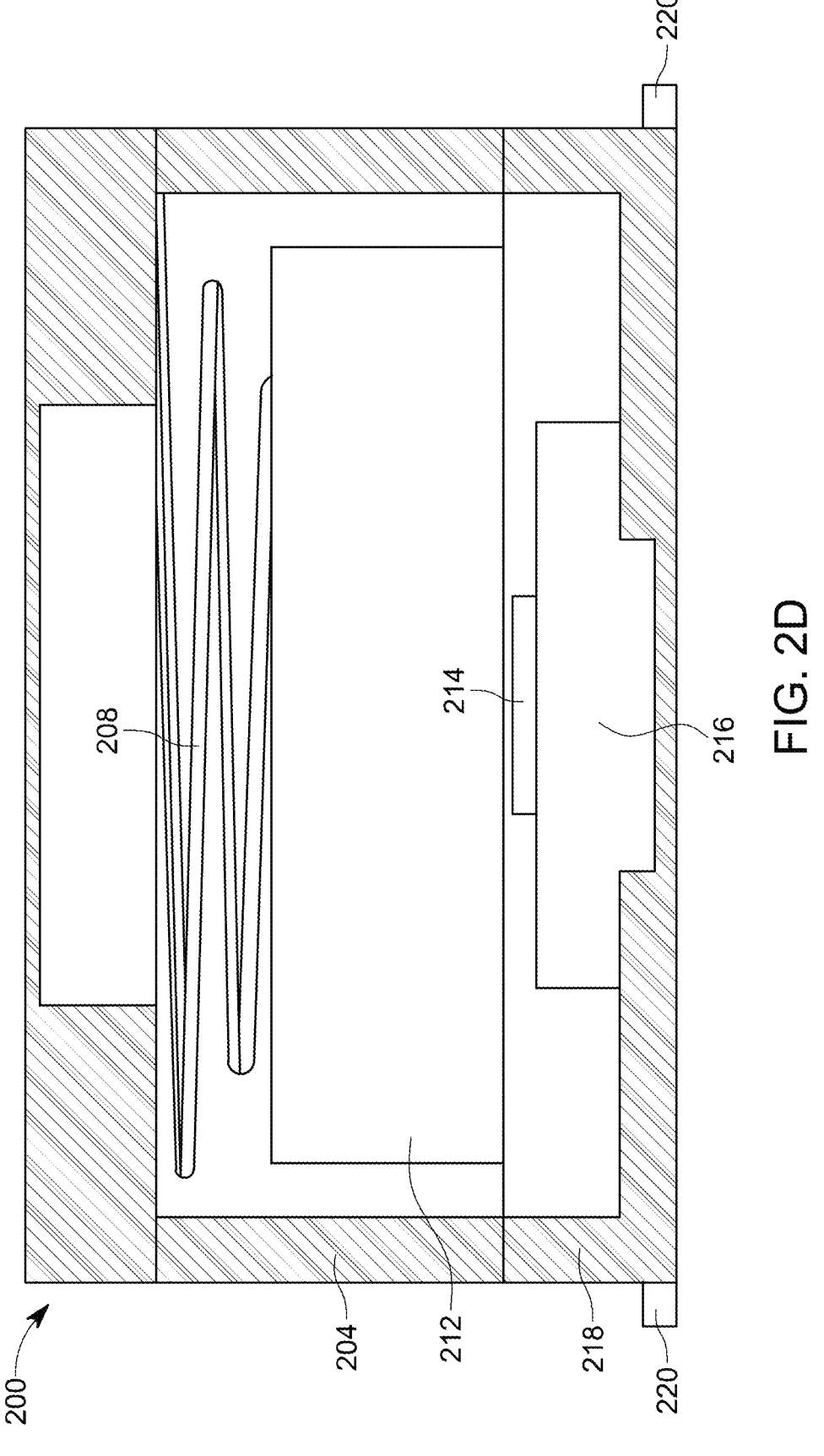
FIG. 2D illustrates a front cut-away suspension-based view of the surface mount haptic actuator of FIG. 2A, in accordance with some implementations.

FIG. 2D illustrates a front cut-away suspension-based view 202d of surface mount haptic actuator 200 of FIG. 2A, in accordance with some implementations. Front cut-away suspension-based view 202d illustrates a front portion of lower housing 218 removed for further illustrating suspension 208 in a lowered position occurring in response to coil 216 activation resulting in a varying magnet field being created thereby causing magnetic counterweight 212 to move up and down quickly for creating a tactile (vibrational) sensation emulating from surface mount haptic actuator 200.

Figure 2E:
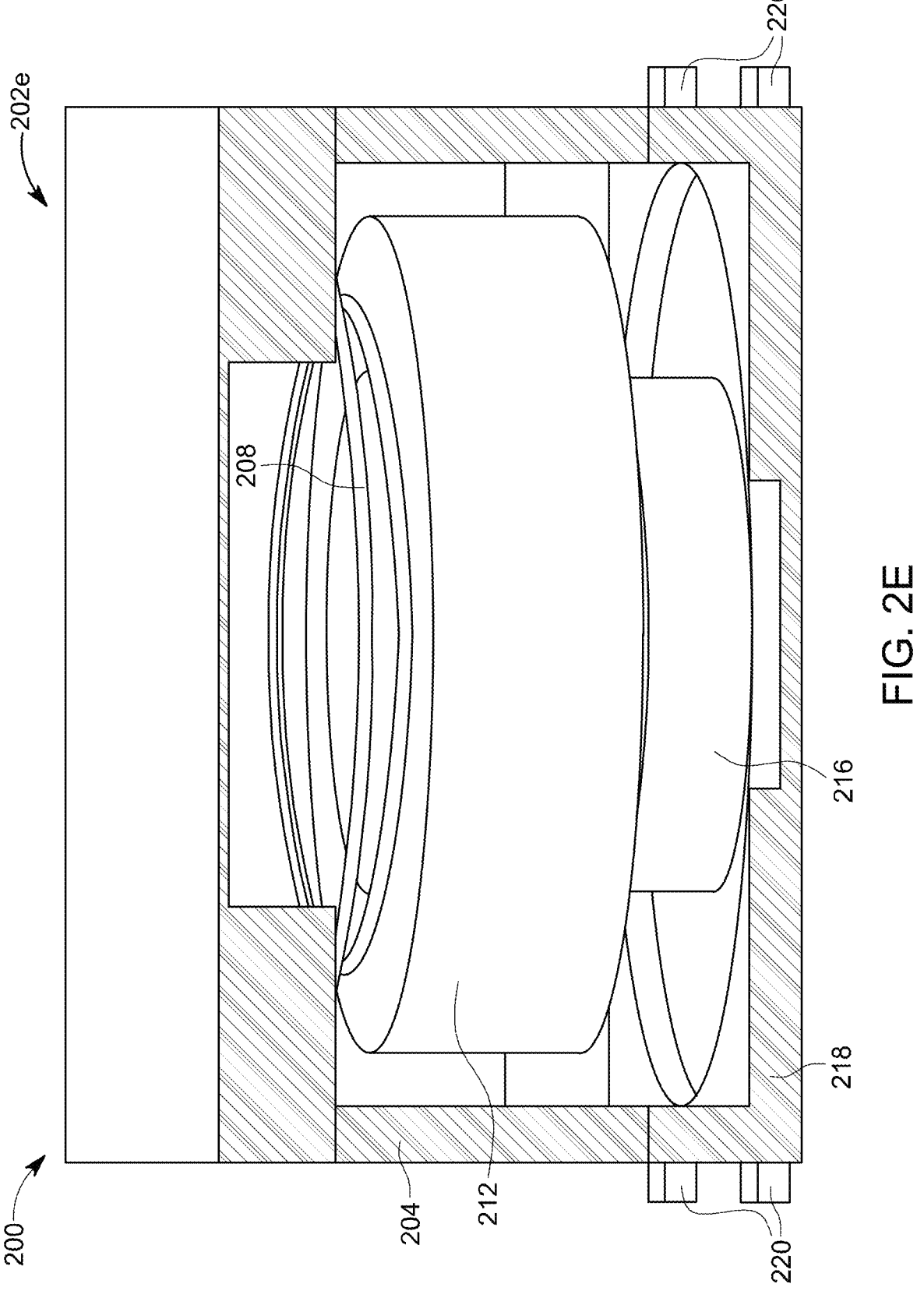
FIG. 2E illustrates a front cut-away tilted suspension-based view of the surface mount haptic actuator of FIG. 2A, in accordance with some implementations.

FIG. 2E illustrates a front cut-away tilted suspension-based view 202e of surface mount haptic actuator 200 of FIG. 2A, in accordance with some implementations.

Figure 2F:
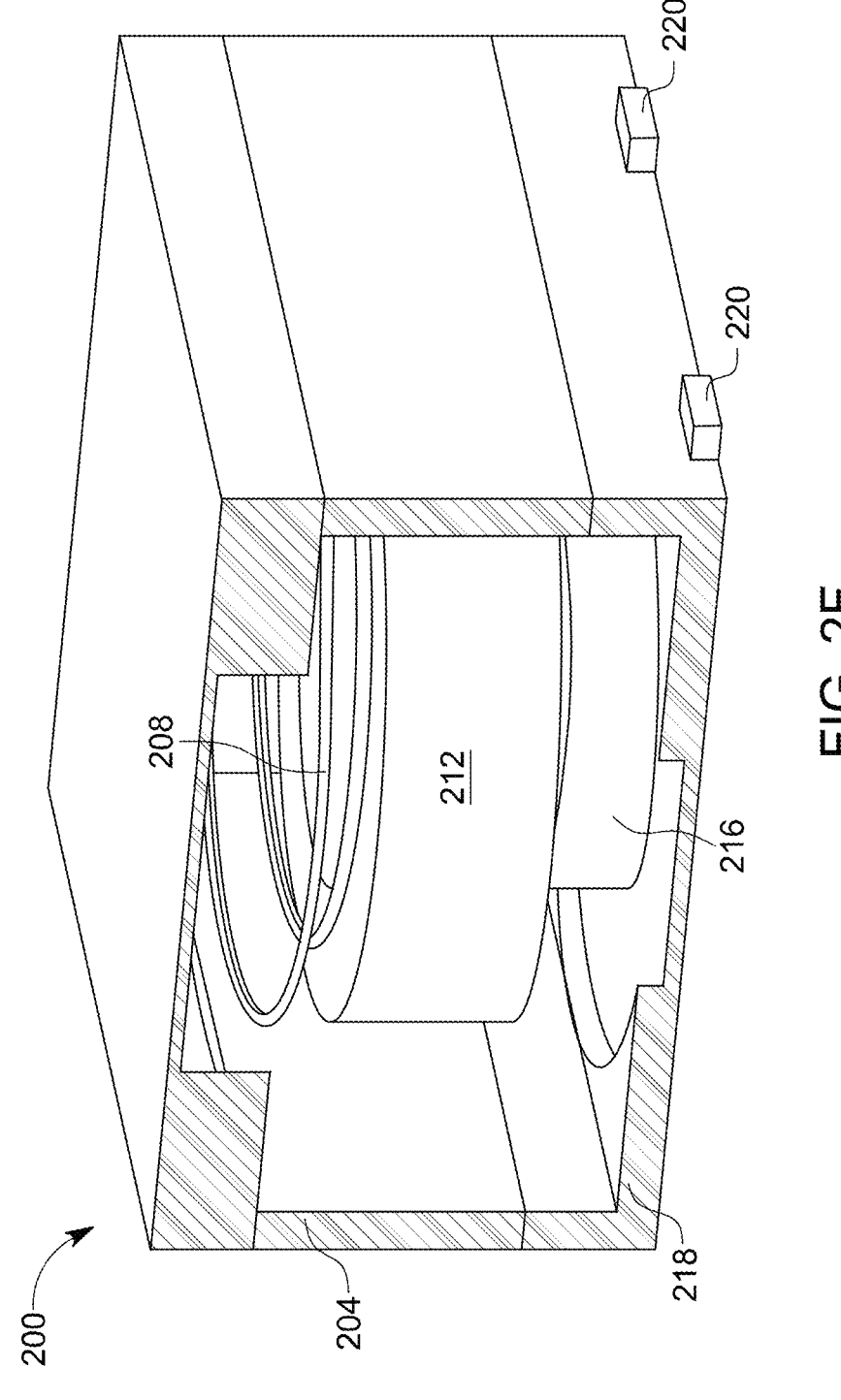
FIG. 2F illustrates a front cut-away isometric suspension-based view of the surface mount haptic actuator of FIG. 2A, in accordance with some implementations.

FIG. 2F illustrates a front cut-away isometric suspension-based view 202f of surface mount haptic actuator 200 of FIG. 2A, in accordance with some implementations.

Figure 2G:
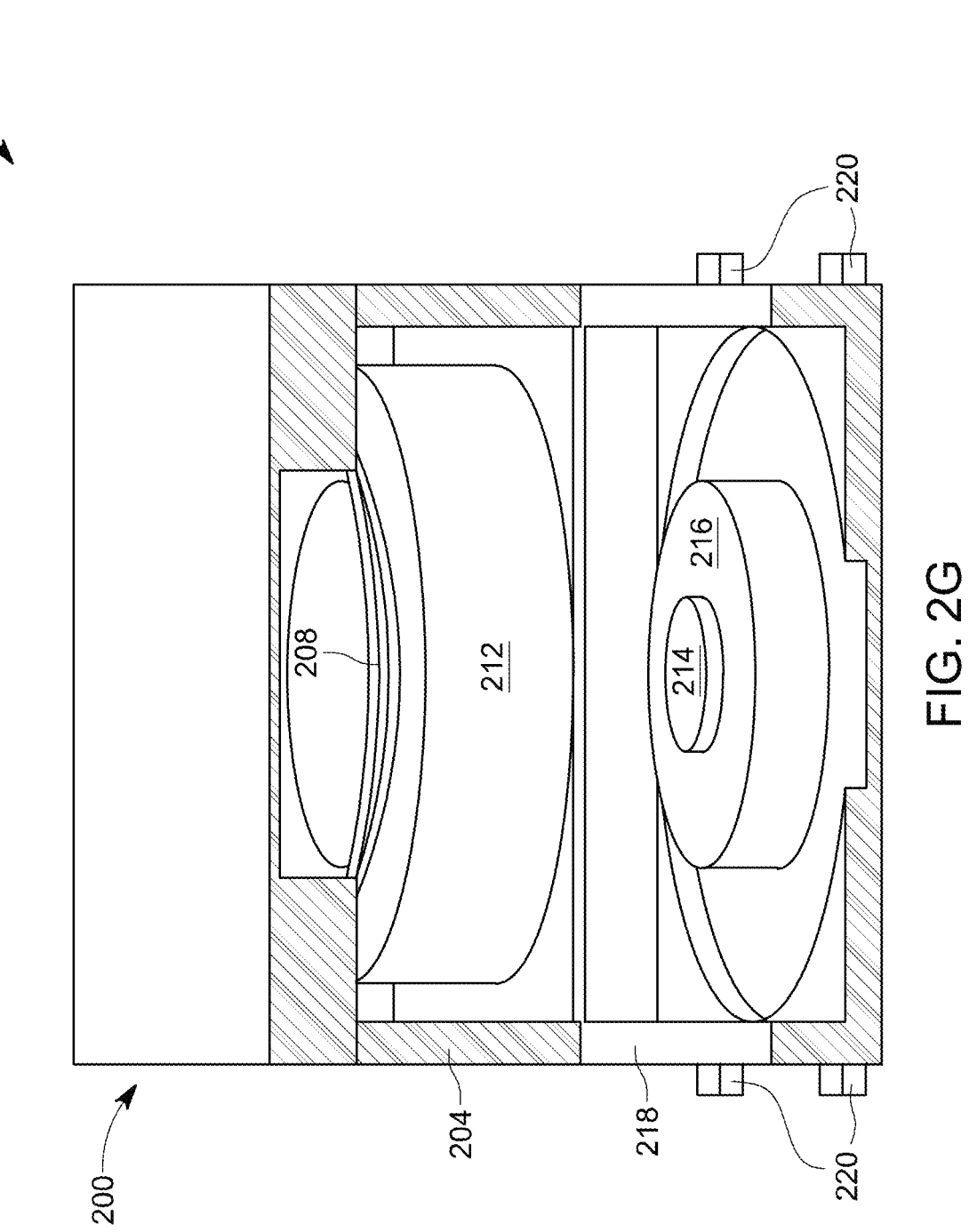
FIG. 2G illustrates a floating front cut-away tilted suspension-based view of the surface mount haptic actuator of FIG. 2A, in accordance with some implementations.

FIG. 2G illustrates a floating front cut-away tilted suspension-based view 202g of surface mount haptic actuator 200 of FIG. 2A, in accordance with some implementations.

Figure 2H:
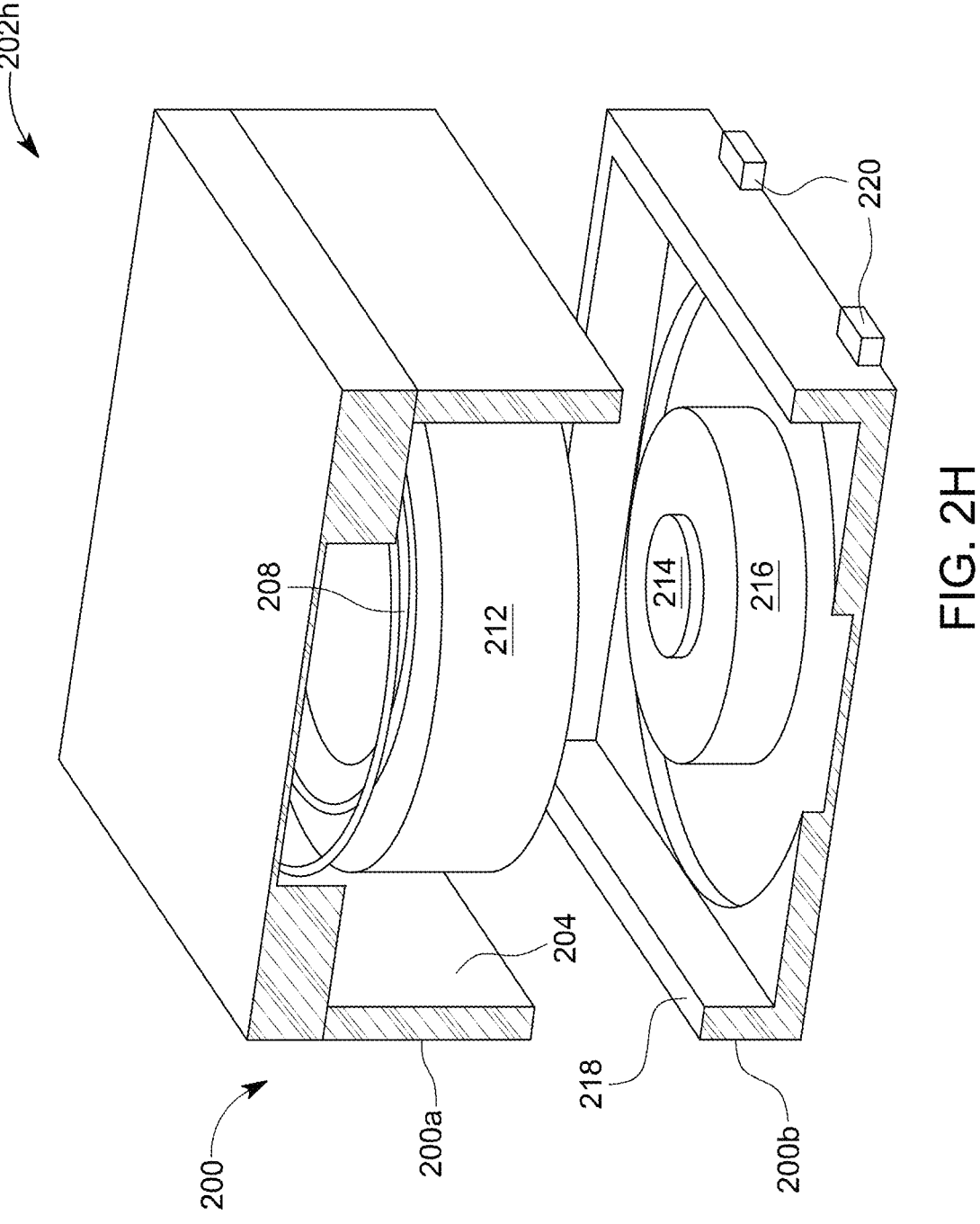
FIG. 2H illustrates a floating front cut-away isometric suspension-based view of the surface mount haptic actuator of FIG. 2A, in accordance with some implementations.

FIG. 2H illustrates a floating front cut-away isometric suspension-based view 202h of surface mount haptic actuator 200 of FIG. 2A, in accordance with some implementations.

Figure 2I:
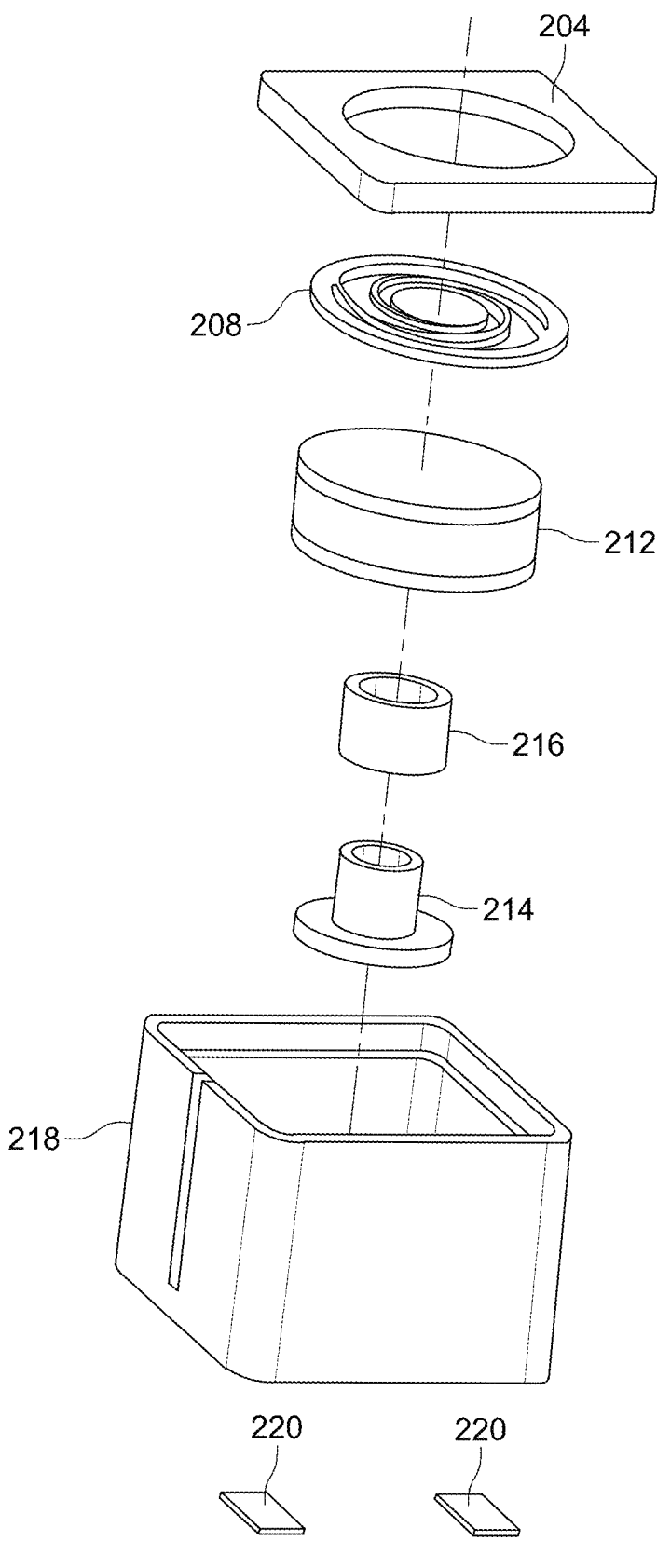
FIG. 2I illustrates an exploded view of the surface mount haptic actuator of FIG. 2I, in accordance with some implementations.

FIG. 2I illustrates an exploded view of surface mount haptic actuator 200 of FIG. 2I, in accordance with some implementations. Exploded view illustrates a 3D appearance independently illustrating lower housing 218, yoke plate 214, coil 216, magnetic counterweight 212, suspension ring 208, upper housing 204, and terminals 220 of surface mount haptic actuator 200.

Figure 2J:
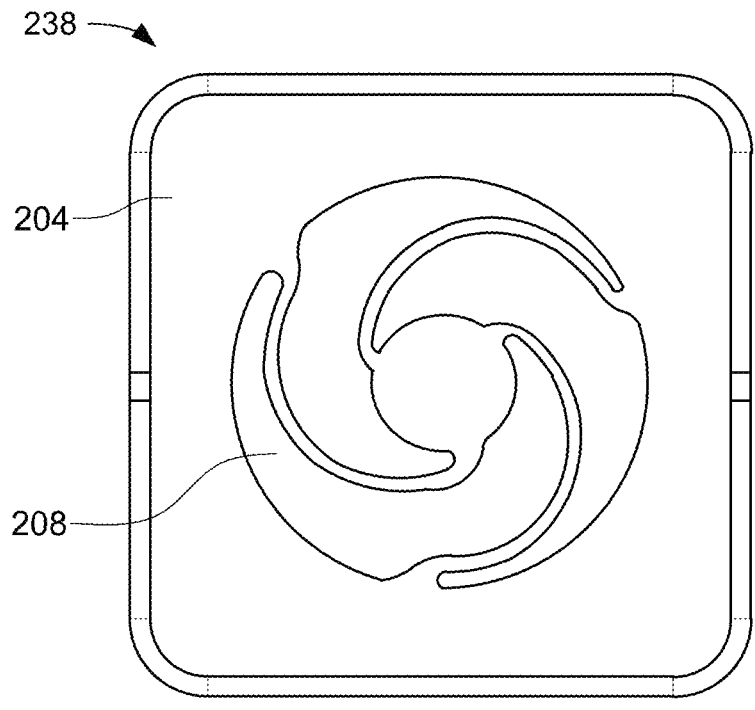
FIG. 2J illustrates a top view of an upper housing and a bottom view of a lower housing of the surface mount haptic actuator of FIG. 1A, in accordance with some implementations.
Figure 2J:
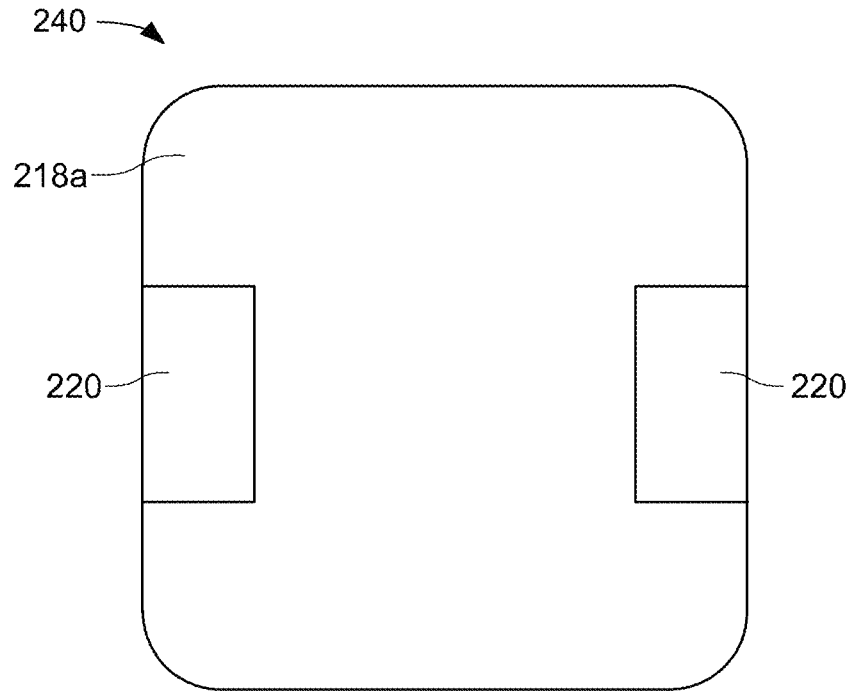

FIG. 2J illustrates a top view 238 of upper housing 204 and a bottom view 240 of lower housing 218 of surface mount haptic actuator 200 of FIG. 1A, in accordance with some implementations. Top view 238 of upper housing 204 illustrates placement of suspension ring 208. Although FIG. 2J illustrates a specified placement of suspension ring 208 with respect to upper housing 204, it may be noted that alternative placement and/or positioning of suspension ring 208 may be used. Bottom view 240 of lower housing 218 illustrates an example of positioning and placement of terminals 220 with respect to lower housing 218. Although FIG. 2J illustrates a specified placement of terminals 220 with respect to lower housing 218, it may be noted that alternative placement and/or positioning of terminals may be used.

FIG. 3 is a flowchart representation of an exemplary method 300 for mounting a haptic actuator on a surface of a printed circuit board, in accordance with some implementations. Method 300 may be performed by processing logic, including hardware, firmware, software, or a combination thereof. In some implementations, method 300 is performed by a processor executing code stored in a non-transitory computer-readable medium (e.g., a memory). Each of the blocks in method 300 may be enabled and executed in any order.

At block 302, method 300 provides a haptic actuator(s) packaged in a tape and reel structure. In some implementations, the haptic actuator includes an outer housing and electrical terminals extending through the outer housing proximate a bottom surface of the outer housing.

At block 304, method 300 picks the haptic actuator out of the tape and reel using a pick and place device. A pick and place (PNP) device or machine may comprise a robotic assembly device that uses a vacuum to lift a component (e.g., a haptic actuator(s)) off of tape (of a tape and reel), rotate the component to a correct orientation, and place the component on a circuit board for execution of a soldering process.

At block 306, method 300 places the haptic actuator (using the pick and place device) on a surface of a printed circuit board that is screened with solder paste.

At block 308, method 300 passes the printed circuit board and haptic actuator through a reflow solder machine in which the temperature is elevated to liquify the solder paste.

At block 310, method 300 allows the liquified solder paste on printed circuit board to solidify and form an electrical connection between the printed circuit board and the electrical terminals extending through the outer housing of the haptic actuator.

FIG. 4 is a flowchart representation of an exemplary method 400 for making a haptic actuator, in accordance with some implementations. Method 300 may be performed manually or by processing logic, including hardware, firmware, software, or a combination thereof. In some implementations, method 400 is performed by a processor executing code stored in a non-transitory computer-readable medium (e.g., a memory). Each of the blocks in method 400 may be enabled and executed in any order.

At block 402, method 400 provides s housing defining an interior chamber.

At block 404, method 400 suspends (by a flexible member) a movable magnetic weight structure within the interior chamber.

At block 406, method 400 positions a stationary conductive coil within the interior chamber and proximate the movable magnetic weigh structure.

At block 408, method 400 places a plurality of surface mountable conductive terminals extending through the housing.

At block 410, the method electrically connects the plurality of conductive terminals to the conductive coil.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Those of ordinary skill in the art will appreciate that well-known systems, methods, components, devices, and circuits have not been described in exhaustive detail so as not to obscure more pertinent aspects of the example implementations described herein. Moreover, other effective aspects and/or variants do not include all of the specific details described herein. Thus, several details are described in order to provide a thorough understanding of the example aspects as shown in the drawings. Moreover, the drawings merely show some example embodiments of the present disclosure and are therefore not to be considered limiting.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general-purpose computing apparatus to a specialized computing apparatus implementing one or more implementations of the present subject matter. Any suitable programming, scripting, or other type of language or combinations of languages may be used to implement the teachings contained herein in software to be used in programming or configuring a computing device.

Implementations of the methods disclosed herein may be performed in the operation of such computing devices. The order of the blocks presented in the examples above can be varied for example, blocks can be re-ordered, combined, and/or broken into sub-blocks. Certain blocks or processes can be performed in parallel. The operations described in this specification can be implemented as operations performed by a data processing apparatus on data stored on one or more computer-readable storage devices or received from other sources.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or value beyond those recited. Headings, lists, and numbering included herein are for ease of explanation only and are not meant to be limiting.

It will also be understood that, although the terms "first," "second," etc. may be used herein to describe various elements, these elements should not be limited by these terms. These terms are only used to distinguish one element from another. For example, a first node could be termed a second node, and, similarly, a second node could be termed a first node, which changing the meaning of the description, so long as all occurrences of the "first node" are renamed consistently and all occurrences of the "second node" are renamed consistently. The first node and the second node are both nodes, but they are not the same node.

The terminology used herein is for the purpose of describing particular implementations only and is not intended to be limiting of the claims. As used in the description of the implementations and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

What is claimed is:

1. A haptic actuator comprising:
a housing defining an interior chamber, wherein the housing includes an upper housing assembly comprising an upper housing plate;
a movable magnetic weight structure suspended within the interior chamber by a flexible member;
a stationary conductive coil positioned within the interior chamber proximate the movable magnetic weight structure, the flexible member mechanically attached to the upper housing plate and the movable magnetic weight structure mechanically attached to the upper housing plate by the flexible member, wherein the housing further comprises a lower housing assembly comprising a lower housing comprising an integrated yoke plate and the stationary conductive coil wound around the integrated yoke plate; and
a plurality of conductive terminals extending through the housing and in electrical contact with the conductive coil.

2. The haptic actuator of claim 1, wherein the lower housing comprises a liquid crystal polymer (LCP) material and the upper housing plate comprises a metallic material.

3. The haptic actuator of claim 1, wherein the movable magnetic weight structure comprises a magnetic counterweight mechanically attached to a T-iron structure and a pole piece structure.

4. The haptic actuator of claim 1, wherein the housing comprises an upper housing assembly comprising an upper housing, the flexible member, and the movable magnetic weight mechanically attached to the upper housing by the flexible member.

5. The haptic actuator of claim 1, wherein the housing comprises a liquid crystal polymer (LCP) material.

6. The haptic actuator of claim 1, wherein plurality of conductive terminals comprise surface mount solderable conductive terminals configured to electrically and mechanically connect the haptic actuator, via a solder application process, to a printed circuit board (PCB) in a surface mount application.

7. The haptic actuator of claim 6, wherein the haptic actuator is configured to withstand lead-free reflow oven temperatures occurring during attachment to the PCB in the surface mount application.

8. The haptic actuator of claim 1, wherein the movable magnetic weight structure is positioned proximate to the stationary conductive coil without being mechanically attached to the stationary conductive coil.

9. The haptic actuator of claim 1, wherein the haptic actuator is a waterproof structure.

10. The haptic actuator of claim 1, wherein the haptic actuator is configured to provide tactile feedback in response to user touch.

11. The haptic actuator of claim 1, wherein the flexible member is mechanically attached to the movable magnetic weight structure by a weld.

12. The haptic actuator of claim 1, wherein the haptic actuator is configured to provide tactile feedback in combination with audio feedback in response to user touch.

13. A method of mounting a haptic actuator on a surface of a printed circuit board, the method comprising:

providing a haptic actuator packaged in a tape and reel structure, wherein the haptic actuator comprises a housing that includes an upper housing assembly having an upper housing plate and a lower housing assembly having a lower housing that define an interior chamber, a movable magnetic weight structure suspended within the interior chamber by a flexible member, a stationary conductive coil positioned within the interior chamber proximate the movable magnetic weight structure and a plurality of conductive terminals extending through the housing proximate a bottom surface of the housing and in electrical contact with the conductive coil, wherein the flexible member is mechanically attached to the upper housing plate and the movable magnetic weight structure is mechanically attached to the upper housing plate by the flexible member, and wherein the lower housing comprises an integrated yoke plate and the stationary conductive coil wound around the integrated yoke plate;

picking the haptic actuator out of the tape and reel using a pick and place device;

placing the haptic actuator using the pick and place device on a surface of a printed circuit board that is screened with solder paste;

passing the printed circuit board and haptic actuator through a reflow solder machine in which the temperature is elevated to liquify the solder paste; and allowing the liquified solder paste on printed circuit board to solidify and form an electrical connection between the printed circuit board and the electrical terminals extending through the housing of the haptic actuator.

14. A method of making a haptic actuator, the method comprising:

providing a housing defining an interior chamber, wherein the housing comprises an upper housing assembly comprising an upper housing plate;

suspending, by a flexible member, a movable magnetic weight structure within the interior chamber;

positioning a stationary conductive coil within the interior chamber and proximate the movable magnetic weigh structure, the flexible member mechanically attached to the upper housing plate and the movable magnetic weight structure mechanically attached to the upper housing plate by the flexible member, wherein the housing further comprises a lower housing assembly comprising a lower housing comprising an integrated yoke plate and the stationary conductive coil wound around the integrated yoke plate;

placing a plurality of surface mountable conductive terminals extending through the housing; and electrically connecting the plurality of conductive terminals to the conductive coil.

\* \* \* \* \*